/ 12) United States Patent
Shang et al.

(10) Patent No.: US 12,073,783 B2
(45) Date of Patent: Aug. 27, 2024

(54) DISPLAY PANEL AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Tinghua Shang, Beijing (CN); Biao Liu, Beijing (CN); Tingliang Liu, Beijing (CN); Huijuan Yang, Beijing (CN); Maoying Liao, Beijing (CN); Yi Zhang, Beijing (CN)

(73) Assignees: CHENGDU OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/638,991

(22) PCT Filed: Mar. 30, 2021

(86) PCT No.: PCT/CN2021/084097
§ 371 (c)(1),
(2) Date: Feb. 28, 2022

(87) PCT Pub. No.: WO2022/204983
PCT Pub. Date: Oct. 6, 2022

(65) Prior Publication Data
US 2024/0038164 A1   Feb. 1, 2024

(51) Int. Cl.
*G09G 3/3233* (2016.01)
*H10K 59/121* (2023.01)
*H10K 59/131* (2023.01)

(52) U.S. Cl.
CPC ....... *G09G 3/3233* (2013.01); *H10K 59/1213* (2023.02); *H10K 59/1315* (2023.02); *G09G 2300/0819* (2013.01); *G09G 2310/08* (2013.01)

(58) Field of Classification Search
CPC ......... G09G 3/3233; G09G 2300/0819; G09G 2310/08; H10K 59/1213; H10K 59/1315
See application file for complete search history.

(56) References Cited

U.S. PATENT DOCUMENTS 7,456,811 B2   11/2008   Kwak
7,960,219 B2    6/2011   Kim et al.
(Continued)

FOREIGN PATENT DOCUMENTS

CN   102654681 A   9/2012
CN   103531106 B   6/2015
(Continued)

OTHER PUBLICATIONS

Written Opinion from PCT/CN2021/084097 dated Dec. 29, 2021.
Search Report from European Application No. 21933664.1 dated Jul. 10, 2023.

*Primary Examiner* — Sahlu Okebato
(74) *Attorney, Agent, or Firm* — Calfee, Halter & Griswold LLP

(57) ABSTRACT

A display panel includes: a pixel driving circuit, a base substrate, a second conductive layer, a third conductive layer. The second conductive layer is disposed on a side of the base substrate, includes first signal lines, orthographic projections of the first signal lines extend in a first direction and spaced apart in a second direction, the first direction and the second direction intersect; the third conductive layer is disposed on a side of the second conductive layer away from the base substrate and includes second signal lines, orthographic projections of the second signal lines extend in the (Continued)

second direction and spaced apart in the first direction; the first signal lines and the second signal lines are configured to provide the same first signal to the pixel driving circuit, part of the first signal lines and the second signal lines are coupled through via holes.

18 Claims, 13 Drawing Sheets

(56) References Cited

U.S. PATENT DOCUMENTS

| | | | |
|---|---|---|---|
| 10,942,609 B2 | 3/2021 | Yang et al. | |
| 2005/0179374 A1 | 8/2005 | Kwak | |
| 2008/0272992 A1 | 11/2008 | Kwak | |
| 2010/0109008 A1 | 5/2010 | Kim et al. | |
| 2015/0317993 A1 | 12/2015 | Lee | |
| 2015/0357394 A1 | 12/2015 | Wang | |
| 2015/0379930 A1 | 12/2015 | Lee | |
| 2016/0210896 A1 | 7/2016 | Gil | |
| 2017/0117351 A1 | 4/2017 | Wang | |
| 2017/0132980 A1 | 5/2017 | Wu | |
| 2019/0088209 A1* | 3/2019 | Kang | G09G 3/3266 |
| 2020/0075640 A1* | 3/2020 | Song | H01L 27/1288 |
| 2020/0091193 A1* | 3/2020 | Ren | H01L 27/1248 |
| 2020/0159350 A1 | 5/2020 | Yang et al. | |
| 2020/0349886 A1* | 11/2020 | Lin | G02F 1/136286 |
| 2021/0191541 A1 | 6/2021 | Yang et al. | |

FOREIGN PATENT DOCUMENTS

| | | |
|---|---|---|
| CN | 102654681 B | 9/2016 |
| CN | 106125421 A | 11/2016 |
| CN | 108957889 A | 12/2018 |
| CN | 109493788 A | 3/2019 |
| CN | 110767720 A | 2/2020 |
| CN | 111198632 A | 5/2020 |
| CN | 210955904 U | 7/2020 |
| JP | 2011022414 A | 2/2011 |
| WO | 2013123781 A1 | 8/2013 |

* cited by examiner

DISPLAY PANEL AND DISPLAY DEVICE

CROSS-REFERENCE

This application is a U.S. national stage of International Application No. PCT/CN2021/084097, filed Mar. 30, 2021, the disclosure of which is hereby incorporated by reference in its entirety.

TECHNICAL FIELD

The present disclosure relates to the field of display technologies, and in particular, to a display panel and a display device.

BACKGROUND

In the related art, a display panel typically includes signal lines such as an initial signal line, an enable signal line, a data signal line, and a power line.

It should be noted that the information disclosed in the Background section above is only for enhancing the understanding of the background of the present disclosure, and thus may include information that does not constitute prior art known to those of ordinary skill in the art.

SUMMARY

According to an aspect of the present disclosure, there is provided a display panel, including a pixel driving circuit, and the display panel further includes: a base substrate, a second conductive layer and a third conductive layer. The second conductive layer is disposed on a side of the base substrate and includes multiple first signal lines, and orthographic projections of the multiple first signal lines on the base substrate extend in a first direction and are spaced apart in a second direction, the first direction and the second direction intersect. The third conductive layer is disposed on a side of the second conductive layer away from the base substrate and includes multiple second signal lines, and orthographic projections of the multiple second signal lines on the base substrate extend in the second direction and are spaced apart in the first direction. The first signal lines and the second signal lines are configured to provide the same first signal to the pixel driving circuit, and at least part of the first signal lines and at least part of the second signal lines are coupled through via holes.

In some embodiments of the present disclosure, the second conductive layer further includes multiple third signal lines, and orthographic projections of the multiple third signal lines on the base substrate extend in the first direction and are spaced apart in the second direction. The third conductive layer further includes multiple fourth signal lines, and orthographic projections of the multiple fourth signal lines on the base substrate extend in the second direction and are spaced apart in the first direction. The third signal lines and the fourth signal lines are configured to provide the same second signal to the pixel driving circuit, and at least part of the third signal lines and at least part of the fourth signal lines are coupled through the via holes.

In some embodiments of the present disclosure, the display panel includes a light emitting unit and a pixel driving circuit configured to drive the light emitting unit, the pixel driving circuit includes multiple transistors, and the display panel further includes: an active layer, disposed between the base substrate and the second conductive layer, at least part of a structure of the active layer is configured to form channel regions of at least part of the transistors, and the active layer includes multiple first active part groups, the multiple first active part groups are spaced apart in the first direction, the first active part group includes multiple first active parts, and orthographic projections of the multiple first active parts on the base substrate are spaced apart in the second direction, and the orthographic projection of the first active part on the base substrate extends in the second direction.

In some embodiments of the present disclosure, the multiple transistors include: a driving transistor, a second transistor, a sixth transistor and a seventh transistor. The driving transistor is configured to output a driving current to a first electrode of the driving transistor based on the driving transistor's gate voltage; a second electrode of the second transistor is coupled to a gate of the driving transistor, a first electrode of the second transistor is coupled to the first electrode of the driving transistor, and a gate of the second transistor is coupled to a gate driving signal terminal. The sixth transistor includes: a first electrode coupled to the first electrode of the driving transistor, a second electrode coupled to a first electrode of the light emitting unit. The first electrode of the light emitting unit can be an anode, and a gate of the light emitting unit is coupled to an enable signal terminal. The seventh transistor includes: a first electrode configured to receive a second initial signal, a second electrode configured to be coupled to the first electrode of the light emitting unit. A part of a structure of the first active part is configured to form a first channel region of the second transistor, and channel regions of the sixth transistor and the seventh transistor.

In some embodiments of the present disclosure, the multiple second signal lines are arranged in a one-to-one correspondence with a part of the first active part groups, and the second signal line includes: multiple first extension parts and a second extension part. The multiple first extension parts are arranged in a one-to-one correspondence with the first active parts, and an orthographic projection of the first extension part on the base substrate extends in the second direction, and any segment of the orthographic projection of the first extension part on the base substrate in the extension direction thereof is at least partially overlapped with an orthographic projection of the first active part corresponding to the first extension part on the base substrate; and the second extension part is coupled between two adjacent first extension parts, and an orthographic projection of the second extension part on the base substrate is not overlapped with the orthographic projections of the first active parts on the base substrate.

In some embodiments of the present disclosure, the display panel includes a light emitting unit and a pixel driving circuit configured to drive the light emitting unit. The pixel driving circuit includes a seventh transistor. The seventh transistor includes a first electrode configured to receive a second initial signal, and a second electrode configured to be coupled to an anode of the light emitting unit. The first signal line and the second signal line are configured to provide a second initial signal to the first electrode of the seventh transistor.

In some embodiments of the present disclosure, the multiple fourth signal lines are arranged in a one-to-one correspondence with a part of the first active part groups, and the fourth signal line includes multiple third extension parts arranged in a one-to-one correspondence with the first active parts, and orthographic projections of the third extension parts on the base substrate extend in the second direction, and any segment of the orthographic projections of the third extension parts on the base substrate in the extension direction thereof is at least partially overlapped with orthographic projections of the first active parts corresponding to the third extension parts on the base substrate.

In some embodiments of the present disclosure, the fourth signal line further includes a fourth extension part coupled between adjacent third extension parts, and an orthographic projection of the fourth extension part on the base substrate extends in the first direction, and any segment of the orthographic projection of the fourth extension part on the base substrate in the extension direction thereof is at least partially overlapped with the orthographic projections of the third signal lines on the base substrate.

In some embodiments of the present disclosure, the multiple transistors include a driving transistor and a first transistor. A second electrode of the first transistor is configured to receive the first initial signal, and a first electrode of the first transistor is coupled to a gate of the driving transistor. The active layer further includes a second active part, an orthographic projection of the second active part on the base substrate extends in the second direction, and the second active part includes a first sub-active part configured to form a first channel region of the first transistor. The fourth signal line further includes a fifth extension part coupled between the fourth extension part and the third extension part that are adjacent to each other, an orthographic projection of the fifth extension part on the base substrate extends in the second direction, and any segment of the orthographic projection of the fifth extension part on the base substrate in the extension direction thereof is at least partially overlapped with the orthographic projection of the second active part on the base substrate.

In some embodiments of the present disclosure, the display panel includes a pixel driving circuit including a first transistor, and a second electrode of the first transistor is configured to receive a first initial signal, and a first electrode of the first transistor is configured to be coupled to the gate of the driving transistor; and the third signal line and the fourth signal line are configured to provide the first initial signal.

In some embodiments of the present disclosure, the active layer further includes a second sub-active part and a third sub-active part, and the second sub-active part is configured to form a second channel region of the first transistor; the third sub-active part is coupled between the first sub-active part and the second sub-active part; and an orthographic projection of the first signal line on the base substrate is at least partially overlapped with an orthographic projection of the third sub-active part on the base substrate.

In some embodiments of the present disclosure, the multiple transistors include: a driving transistor and a second transistor, the driving transistor is configured to output a driving current to its first electrode based on its gate voltage; a second electrode of the second transistor is coupled to a gate of the driving transistor, a first electrode is coupled to a first electrode of the driving transistor, and the gate is coupled to a gate driving signal terminal. The first active part further includes a fourth sub-active part, and the fourth sub-active part is configured to form a first channel region of the second transistor. The active layer further includes a fifth sub-active part and a sixth sub-active part, the fifth sub-active part is configured to form a second channel region of the second transistor; the sixth sub-active part is coupled between the fourth sub-active part and the fifth sub-active part; the second conductive layer further includes: multiple first conductive parts, the first conductive parts include first sub-conductive parts, and orthographic projections of the first sub-conductive parts on the base substrate are at least partially overlapped with an orthographic projection of the sixth sub-active part on the base substrate.

In some embodiments of the present disclosure, the fourth signal line further includes a sixth extension part coupled between the fifth extension part and the third extension part that are adjacent to each other; the first conductive part further includes a second sub-conductive part coupled to the first sub-conductive part; in the second direction, an orthographic projection of the second sub-conductive part on the base substrate is disposed between orthographic projections of two adjacent first active parts on the base substrate, and in the second direction, the orthographic projection of the second sub-conductive part on the base substrate is disposed between the orthographic projection of the second active part on the base substrate and the orthographic projection of the first active part on the base substrate; a part of the first conductive parts are arranged correspondingly to the second signal lines, and a part of the first conductive parts are arranged correspondingly to the fourth signal lines; an orthographic projection of the second sub-conductive part arranged correspondingly to the second signal line on the base substrate is at least partially overlapped with an orthographic projection of the second extension part on the base substrate; and an orthographic projection of the second sub-conductive part arranged correspondingly to the fourth signal line on the base substrate is at least partially overlapped with an orthographic projection of the sixth extension part on the base substrate.

In some embodiments of the present disclosure, the display panel further includes a first conductive layer disposed between the active layer and the second conductive layer, the first conductive layer includes: a second conductive part and a gate driving signal line, the second conductive part is configured to form the gate of the driving transistor; a part of the gate driving signal line is configured to form a first gate of the second transistor, and an orthographic projection of the gate driving signal line on the base substrate extends in the first direction, and the orthographic projection of the gate driving signal line on the base substrate is disposed between the orthographic projection of the second conductive part on the base substrate and the orthographic projection of the first signal line on the base substrate; and the active layer further includes a seventh sub-active part coupled between the fifth sub-active part and the second sub-active part. The third conductive part further includes: a first connection part respectively coupled to the seventh sub-active part and the second conductive part through via holes; the first conductive part further includes a third sub-conductive part coupled to the second sub-conductive part, and in the second direction, an orthographic projection of the third sub-conductive part on the base substrate is disposed between the orthographic projection of the second sub-conductive part on the base substrate and the orthographic projection of the gate driving signal line on the base substrate.

In some embodiments of the present disclosure, the second signal lines and the fourth signal lines are alternately arranged in sequence in the first direction; the multiple second signal lines and the multiple fourth signal lines form multiple initial signal lines; the second direction is a column direction, and each column of the pixel driving circuits is correspondingly coupled to one of the initial signal lines.

In some embodiments of the present disclosure, a pixel driving circuit correspondingly coupled to the second signal line is located in a red or blue sub-pixel unit, and a pixel driving circuit correspondingly coupled to the fourth signal line is located in a green sub-pixel unit.

In some embodiments of the present disclosure, a sheet resistance of the second conductive layer is greater than a sheet resistance of the third conductive layer.

In some embodiments of the present disclosure, the third conductive layer further includes: a power line, and an orthographic projection of the power line on the base substrate extends in the second direction, and the power line is configured to provide a power signal.

According to an aspect of the present disclosure, there is provided a display device including the above-mentioned display panel.

It should be noted that the above general description and the following detailed description are merely exemplary and explanatory and should not be construed as limiting of the disclosure.

BRIEF DESCRIPTION OF THE DRAWINGS

The drawings here are incorporated into the specification and constitute a part of the specification, show embodiments in accordance with the present disclosure, and are used together with the specification to explain the principle of the present disclosure. Apparently, the drawings in the following description are only some embodiments of the present disclosure. For those of ordinary skill in the art, other drawings can be obtained based on these drawings without creative work.

DETAILED DESCRIPTION

Figure 1:
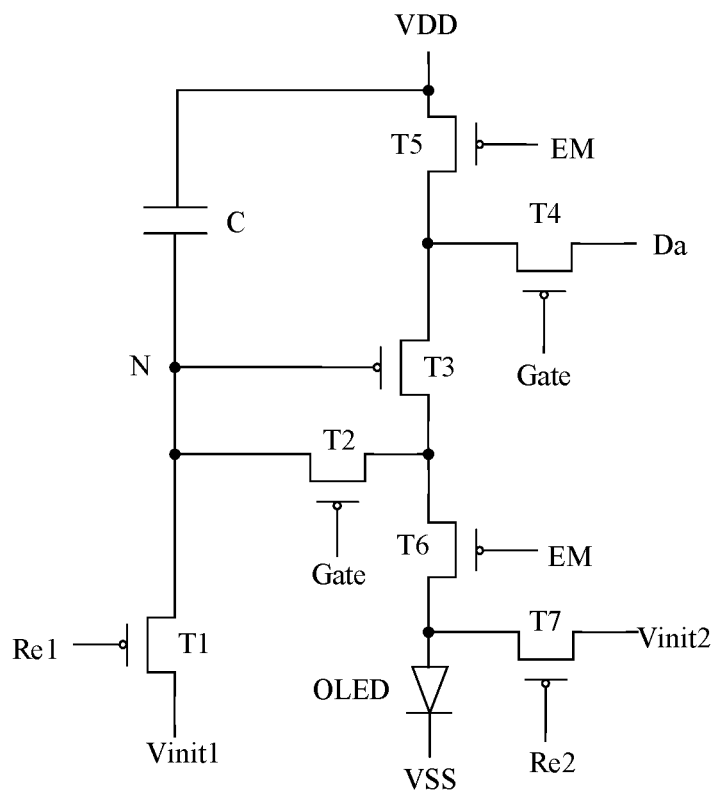
FIG. 1 is a schematic diagram illustrating a circuit structure of a pixel driving circuit in a display panel according to an exemplary embodiment of the present disclosure.

Exemplary embodiments will now be described more fully with reference to the accompanying drawings. However, the exemplary embodiments can be implemented in a variety of forms and should not be construed as being limited to the examples set forth herein; rather, these embodiments are provided so that the present disclosure will be more full and complete so as to convey the idea of the exemplary embodiments to those skilled in this art. The same reference numerals in the drawings denote the same or similar parts, and the repeated description thereof will be omitted.

Although the relative terms such as "above" and "below" are used in the specification to describe the relative relationship of one component to another component shown, these terms are only for convenience in this specification, for example, according to an exemplary direction shown in the drawings. It will be understood that if the device shown is flipped upside down, the component described "above" will become the component "below". Other relative terms, such as "high", "low", "top", "bottom", "left", "right", etc., also have similar meanings. When a structure is "on" another structure, it may mean that a structure is integrally formed on another structure, or that a structure is "directly" disposed on another structure, or that a structure is "indirectly" disposed on another structure through other structures.

The terms "one", "a", and "said" are used to indicate that there are one or more elements/components or the like; the terms "include" and "have" are used to indicate an open meaning of including and means that there may be additional elements/components/etc. in addition to the listed elements/components/etc.

FIG. 1 is a schematic diagram illustrating a circuit structure of a pixel driving circuit in a display panel according to an exemplary embodiment of the present disclosure. As shown in FIG. 1, the pixel driving circuit may include: a first transistor T1, a second transistor T2, a driving transistor T3, a fourth transistor T4, a fifth transistor T5, a sixth transistor T6, a seventh transistor T7, and a capacitor C. The first transistor T1 includes a first electrode coupled to a node N, a second electrode coupled to a first initial signal terminal Vinit1, and a gate coupled to a reset signal terminal Re1. The second transistor T2 includes a first electrode coupled to a first electrode of the driving transistor T3, a second electrode coupled to the node N, and a gate coupled to a gate driving signal terminal Gate. A gate of the driving transistor T3 is coupled to the node N. The fourth transistor T4 includes a first electrode coupled to a data signal terminal Da, a second electrode coupled to a second electrode of the driving transistor T3, and a gate coupled to the gate driving signal terminal Gate. The fifth transistor T5 includes a first electrode coupled to a first power terminal VDD, a second electrode coupled to the second electrode of the driving transistor T3, and a gate coupled to an enable signal terminal EM. The sixth transistor T6 includes a first electrode coupled to the first electrode of the driving transistor T3, and a gate coupled to the enable signal terminal EM. The seventh transistor T7 includes a first electrode coupled to a second initial signal terminal Vinit2, a second electrode coupled to the second electrode of the sixth transistor T6, and a gate coupled to a reset signal terminal Re2. The capacitor C is coupled between the gate of the driving transistor T3 and the first power terminal VDD. The pixel driving circuit may be coupled to a light emitting unit OLED to drive the light emitting unit OLED to emit light, and the light emitting unit OLED may be coupled between the second electrode of the sixth transistor T6 and a second power terminal VSS. The transistors T1-T7 may all be P-type transistors.

Figure 2:
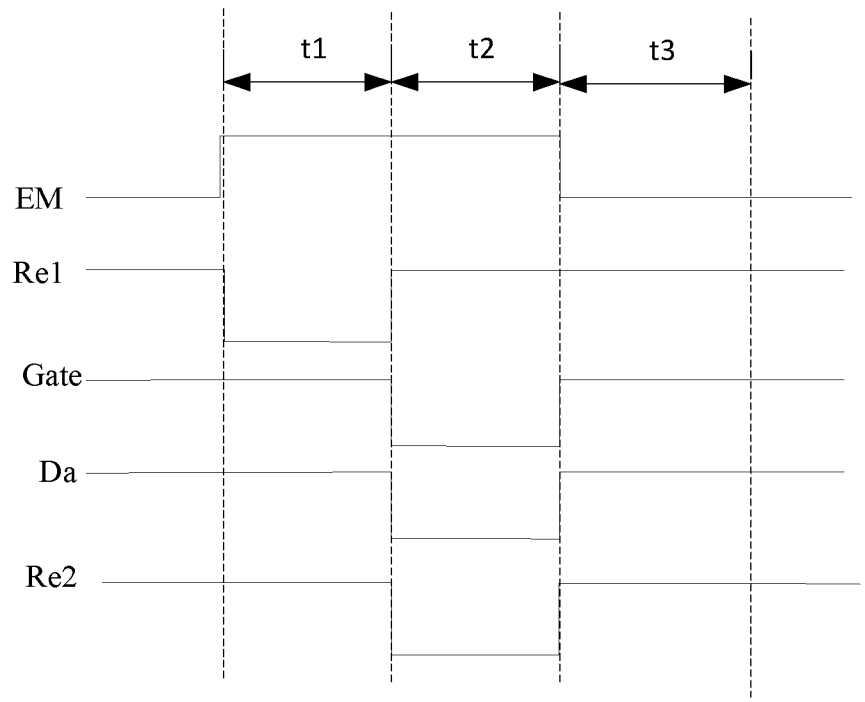
FIG. 2 is a timing diagram of each node in a driving method for the pixel driving circuit in FIG. 1.

FIG. 2 is a timing diagram of each node in a driving method for the pixel driving circuit of FIG. 1. As shown in FIG. 2, 'Gate' represents a timing of the gate driving signal terminal Gate, 'Re1' represents a timing of the reset signal terminal Re1, 'Re2' represents a timing of the reset signal terminal Re2, 'EM' represents a timing of the enable signal terminal EM, and 'Da' represents a timing of the data signal terminal Da. The driving method for the pixel driving circuit may include a reset stage t1, a compensation stage t2, and a light emitting stage t3. In the reset stage t1, the reset signal terminal Re1 outputs a low level signal, the first transistor T1 is turned on, and the first initial signal terminal Vinit1 inputs an initial signal to the node N. In the compensation stage t2, the reset signal terminal Re2 and the gate driving signal terminal Gate output a low level signal, the fourth transistor T4, the second transistor T2, and the seventh transistor T7 are turned on, and the data signal terminal Da outputs a driving signal at the same time to write a voltage Vdata+Vth to the node N, where Vdata is a voltage of the driving signal, Vth is a threshold voltage of the driving transistor T3, and the second initial signal terminal Vinit2 inputs an initial signal to the second electrode of the sixth transistor T6. In the light emitting stage t3, the enable signal terminal EM outputs the low level signal, the sixth transistor T6 and the fifth transistor T5 are turned on, and the driving transistor T3 emits light under the action of the voltage Vdata+Vth stored in the capacitor C. The output current of a driving transistor is formulated as: $I=(\mu W Cox/2\ L)(Vgs-Vth)^2$, where is a carrier mobility; Cox is a gate capacitance per unit area, W is a channel width of the driving transistor, and L is a channel length of the driving transistor, Vgs is a gate-source voltage difference of the driving transistor, and Vth is a threshold voltage of the driving transistor. As for the pixel driving circuit of the present disclosure, the output current of the driving transistor is: $I=(\mu W Cox/2\ L)(Vdata+Vth-Vdd-Vth)^2$. The pixel driving circuit can avoid influence of the threshold of the driving transistor on the output current of the driving transistor.

The pixel driving circuit can provide the first initial signal to the node N through the first initial signal terminal Vinit1, and provide the second initial signal to an electrode of the light emitting unit through the second initial signal terminal Vinit2, respectively. An effective voltage level of the first initial signal and the second initial signal may not be equal. Therefore, the pixel driving circuit may provide different initial signals to the node N and the electrode of the light emitting unit according to actual requirements.

Figure 3:
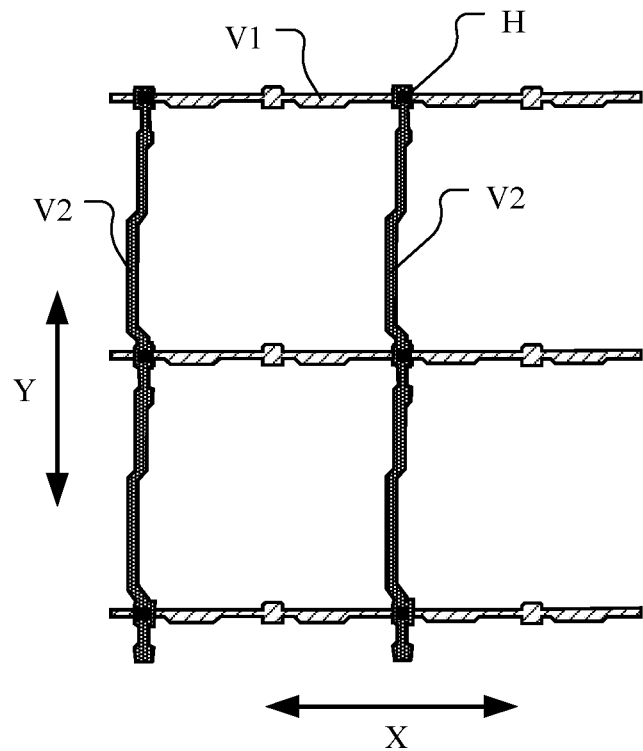
FIG. 3 is a structural layout diagram of a display panel according to an exemplary embodiment of the present disclosure.

The exemplary embodiment first provides a display panel, which may include multiple pixel driving circuits. FIG. 3 is a structural layout diagram of a display panel according to an exemplary embodiment of the present disclosure. As shown in FIG. 3, the display panel may include: a base substrate, a second conductive layer and a third conductive layer. The second conductive layer is disposed on a side of the base substrate and may include multiple first signal lines V1, and orthographic projections of the multiple first signal lines V1 on the base substrate may extend in a first direction X and be spaced apart in a second direction Y, the first direction X and the second direction Y may intersect, for example, the first direction X may be a row direction, and the second direction may be a column direction. The third conductive layer is disposed on a side of the second conductive layer away from the base substrate and may include multiple second signal lines V2, and orthographic projections of the multiple second signal lines V2 on the base substrate may extend in the second direction Y and be spaced apart in the first direction X. The first signal line V1 and the second signal line V2 may provide the same first signal to the pixel driving circuit. An orthographic projection of the first signal line V1 on the base substrate may intersect with an orthographic projection of the second signal line V2 on the base substrate, and at least part of the first signal lines and at least part of the second signal lines may be coupled through via holes H, and the via holes may be located where the first signal lines and the second signal lines intersect.

In the exemplary embodiment, the first signal lines and the second signal lines may form a mesh structure, and the signal lines of the mesh structure have relatively low resistance, so that the first signal transmitted on the first signal lines and the second signal lines may have a small voltage drop.

It should be noted that the orthographic projection of the first signal line on the base substrate extending along the first direction can be understood that the orthographic projection of the first signal line on the base substrate substantially extends in the first direction, that is, the orthographic projection of the first signal line on the base substrate may straight extend in the first direction, and may also meander along the first direction. Similarly, the description of "an orthographic projection of a structure A on the base substrate extends in a direction B" can be understood as that the orthographic projection of the structure A on the base substrate can straight extend in the direction B or meander along the direction B.

In this exemplary embodiment, a structure of the pixel driving circuit in the display panel may be as shown in FIG. 1, and the first signal lines and the second signal lines may provide driving signals to the second initial signal terminal Vinit2 of the pixel driving circuit in FIG. 1. Each first signal line may be coupled to each second signal line through the via hole H. It should be understood that, in other exemplary embodiments, the pixel driving circuit in the display panel may also have other structures, and the first signal lines and the second signal lines may also be used to provide other signals to the pixel driving circuit. For example, the first signal lines and the second signal lines may provide signals to the first power terminal VDD of the pixel driving circuit in FIG. 1. The first signal lines may also be coupled to only part of the second signal lines through the via holes, and the second signal lines may also only be coupled to part of the first signal lines through the via holes.

Figure 4:
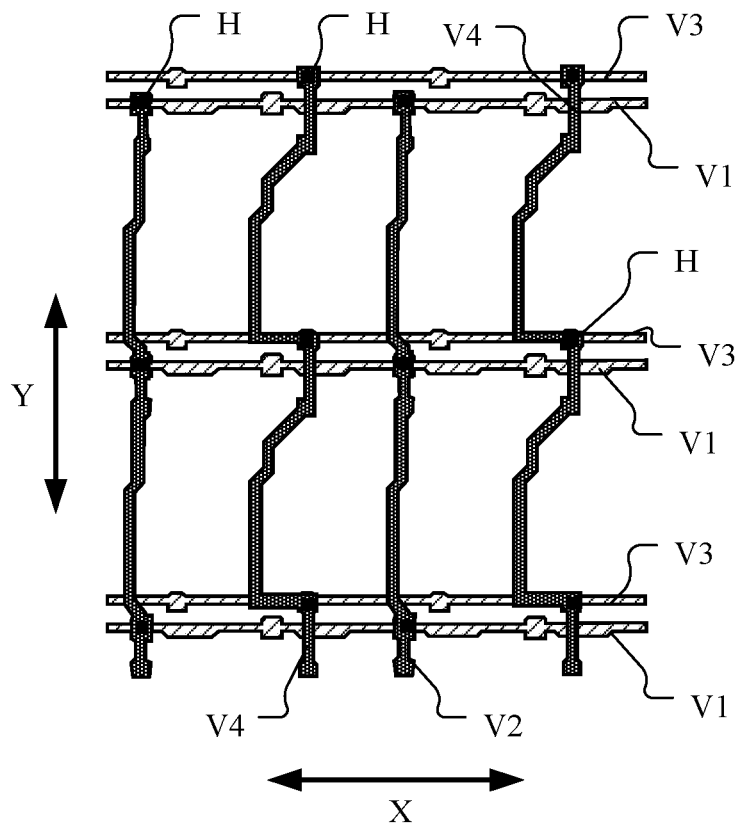
FIG. 4 is a structural layout diagram of a display panel according to another exemplary embodiment of the present disclosure.

FIG. 4 is a structural layout diagram of a display panel according to another exemplary embodiment of the present disclosure. As shown in FIG. 4, the second conductive layer in this exemplary embodiment may further include multiple third signal lines V3, and orthographic projections of the multiple third signal lines V3 on the base substrate may extend in the first direction X and be spaced apart in the second direction Y The third conductive layer may further include multiple fourth signal lines V4, and orthographic projections of the multiple fourth signal lines V4 on the base substrate may extend in the second direction Y and be spaced apart in the first direction X. The third signal line V3 and the fourth signal line V4 may be used to provide the same second signal to the pixel driving circuit. An orthographic projection of the third signal line V3 on the base substrate may intersect with an orthographic projection of the fourth signal line V4 on the base substrate, and at least part of the third signal lines and at least part of the fourth signal lines may be coupled through the via holes H, and the via holes may be located at positions where the third signal lines V3 and the fourth signal lines V4 intersect.

In this exemplary embodiment, the third signal lines and the fourth signal lines may form the mesh structure, and signal lines of the mesh structure have relatively low resistance, so that the second signals transmitted on the first signal lines and the second signal lines can have a small voltage drop.

In this exemplary embodiment, the structure of the pixel driving circuit in the display panel may be as shown in FIG. 1, and the third signal line and the fourth signal line may provide the driving signals to the first initial signal terminal Vinit1 of the pixel driving circuit in FIG. 1. Each third signal line may be coupled to each fourth signal line through the via hole H. It should be understood that, in other exemplary embodiments, the third signal line and the fourth signal line may also be used to provide other signals to the pixel driving circuit. The third signal lines may also be coupled to only part of the fourth signal lines through the via holes, and the fourth signal lines may also be coupled to only part of the third signal lines through the via holes.

Hereinafter, an overall structure of the display panel of the exemplary embodiments will be described in detail.

Figure 6:
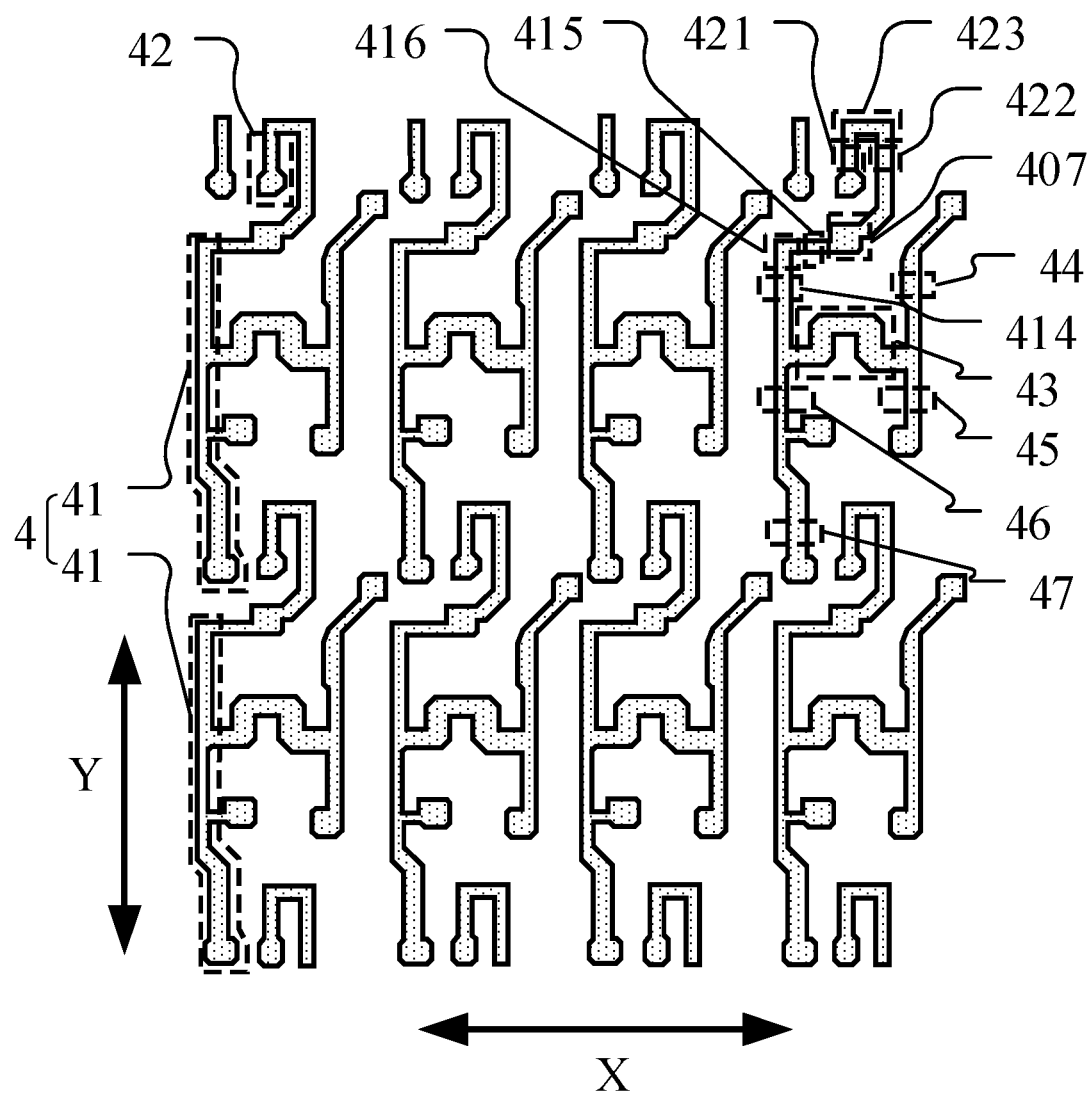
FIG. 6 is a structural layout of an active layer in FIG. 5.
Figure 7:
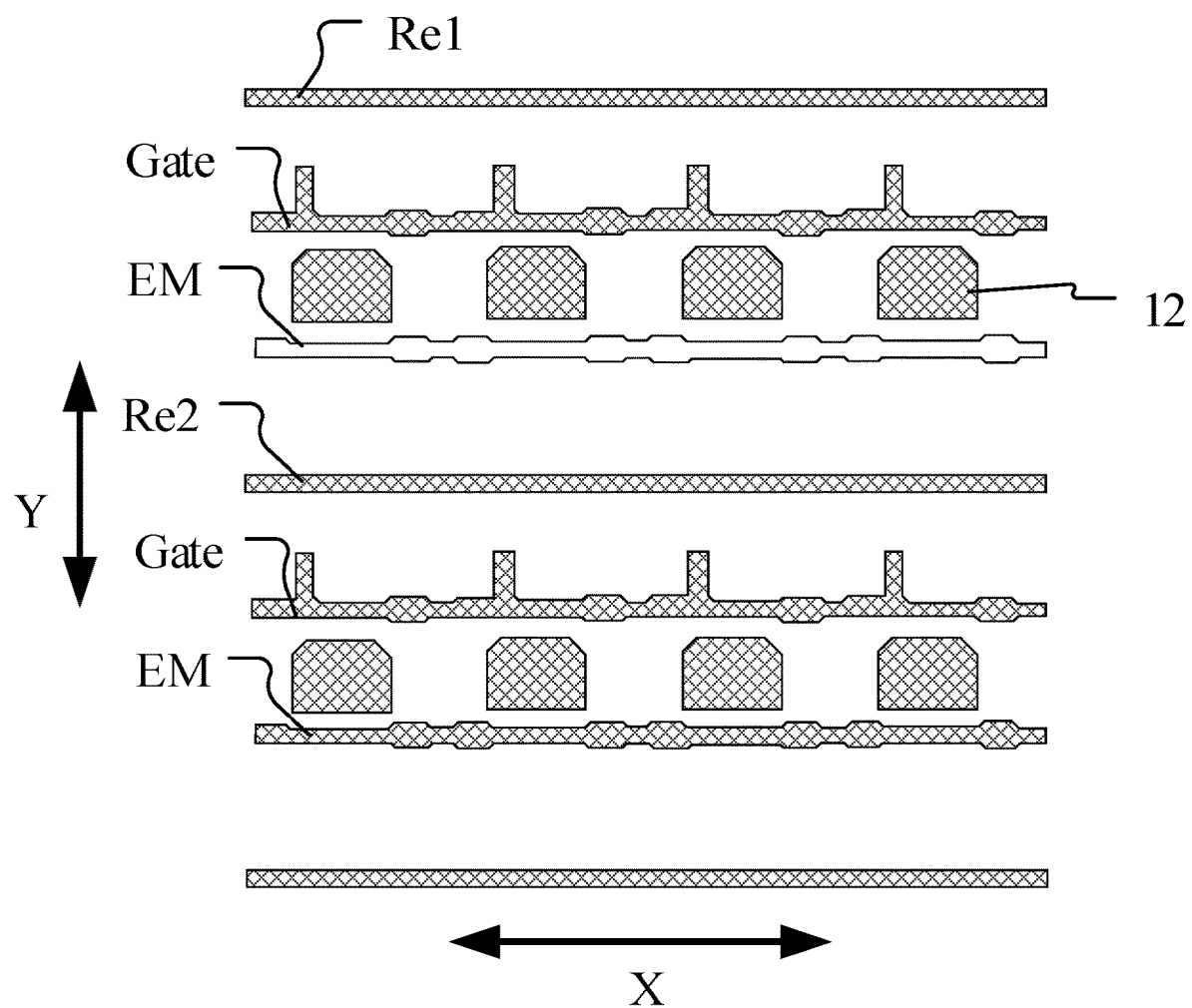
FIG. 7 is a structural layout of a first conductive layer in FIG. 5.
Figure 8:
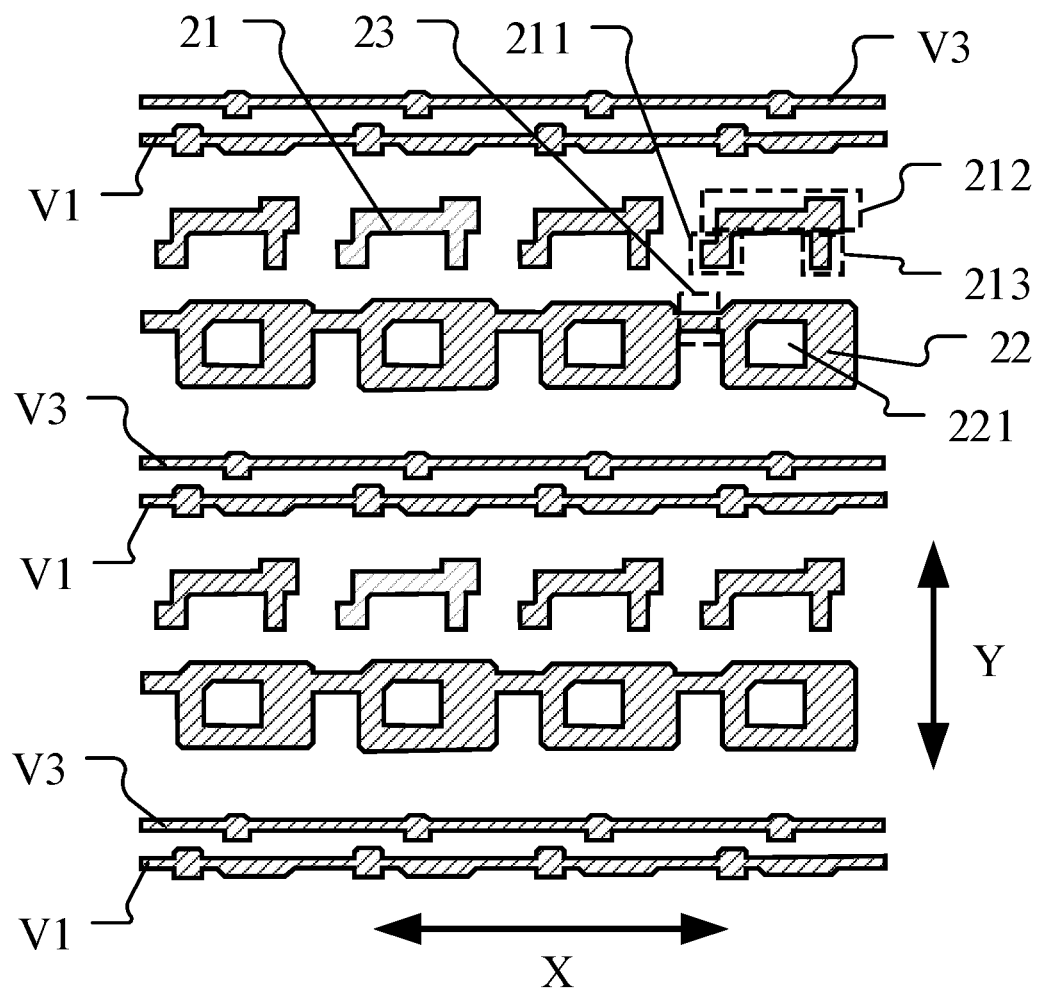
FIG. 8 is a structural layout of a second conductive layer in FIG. 5.
Figure 9:
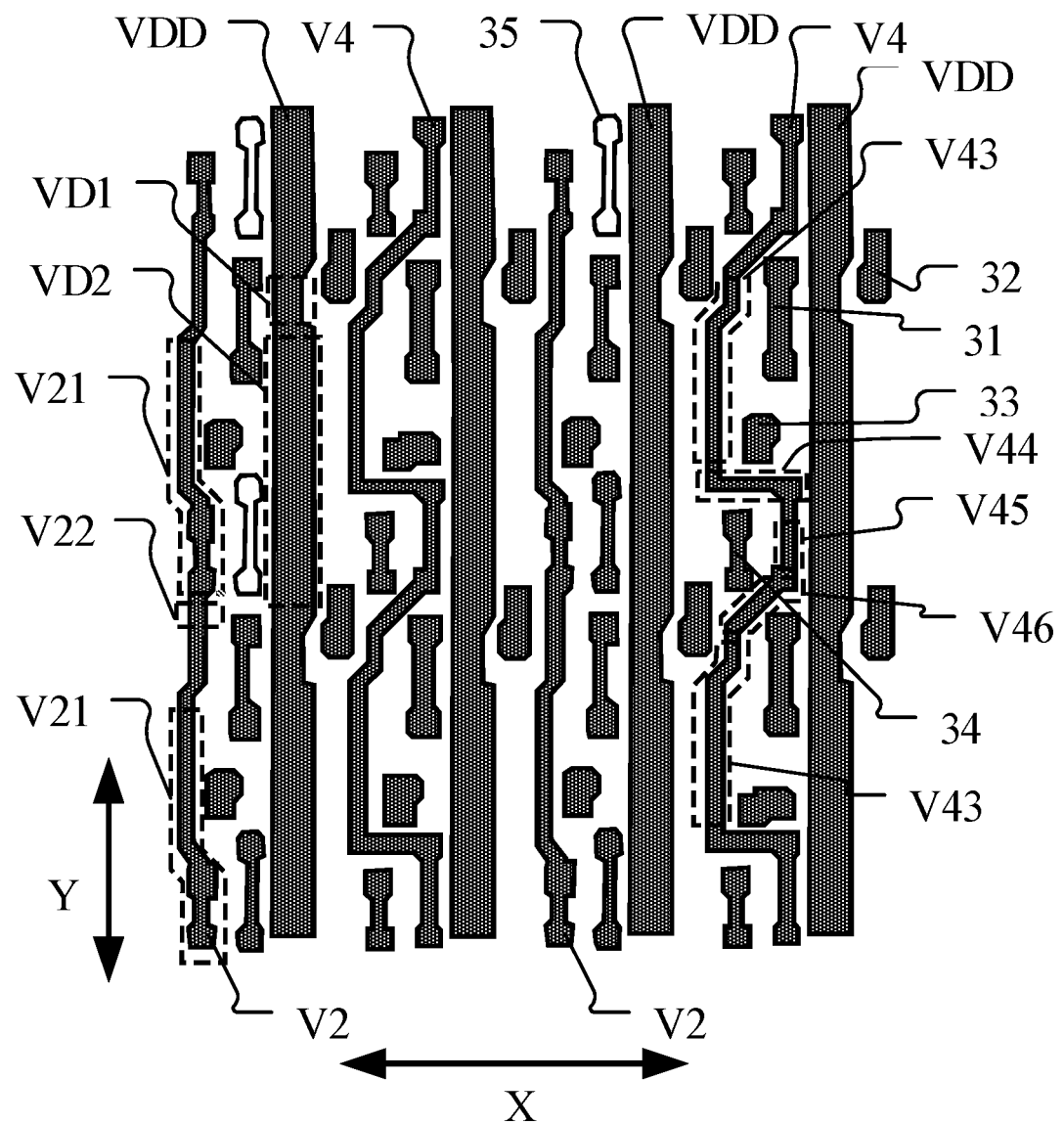
FIG. 9 is a structural layout of a third conductive layer in FIG. 5.
Figure 10:
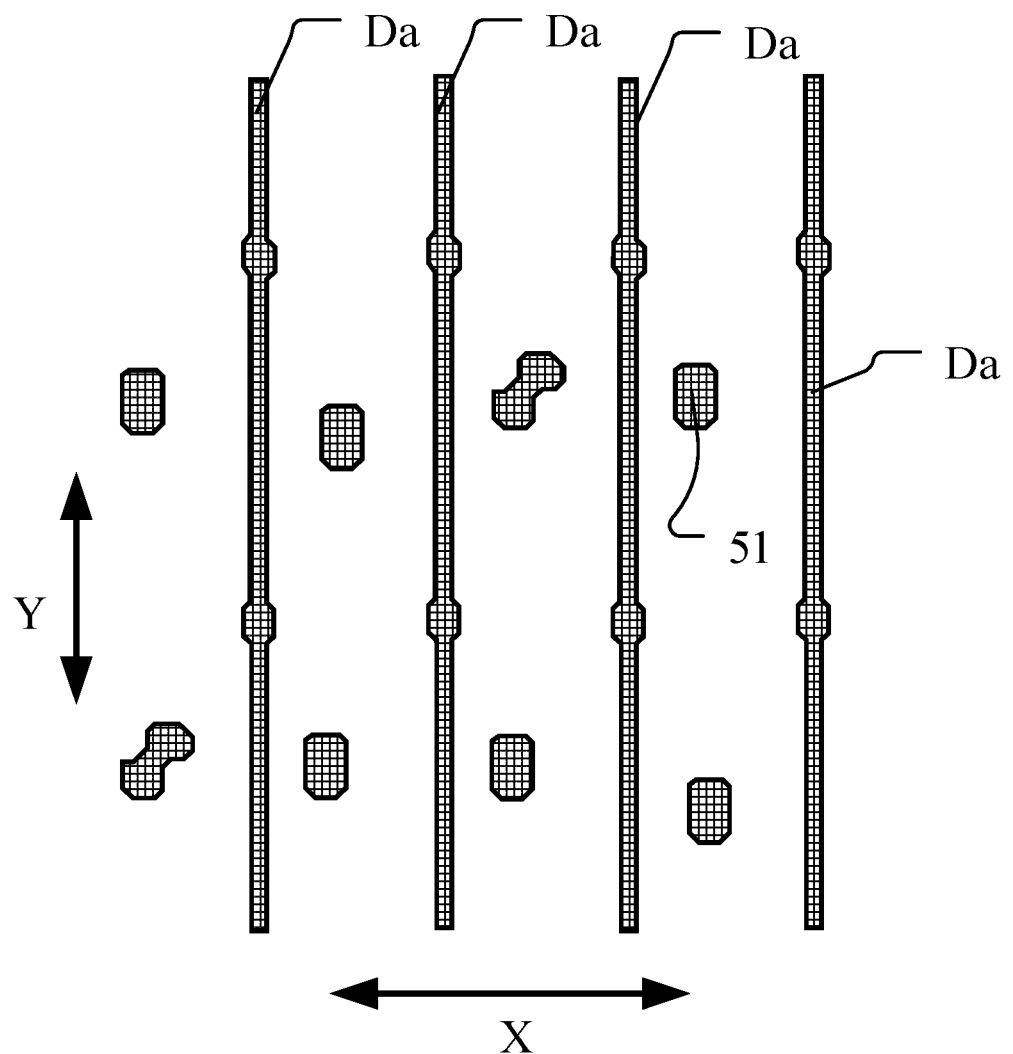
FIG. 10 is a structural layout of a fourth conductive layer in FIG. 5.
Figure 11:
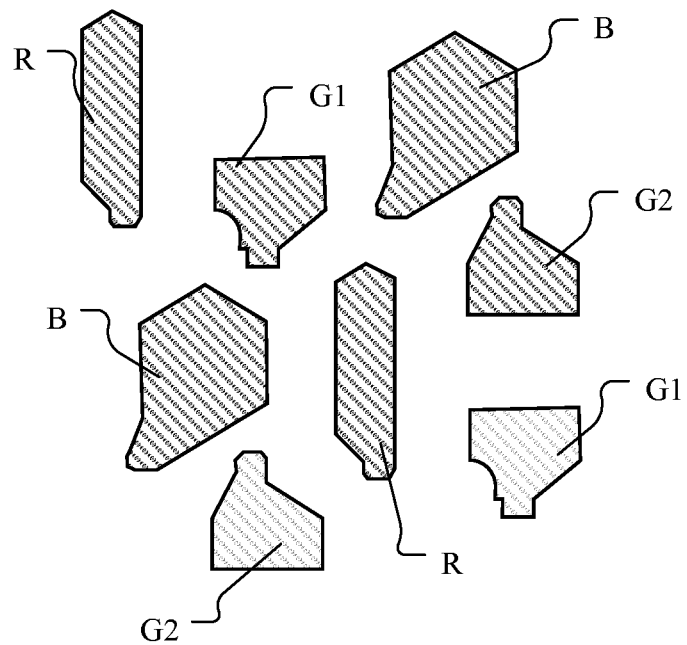
FIG. 11 is a structural layout of an anode layer in FIG. 5.
Figure 12:
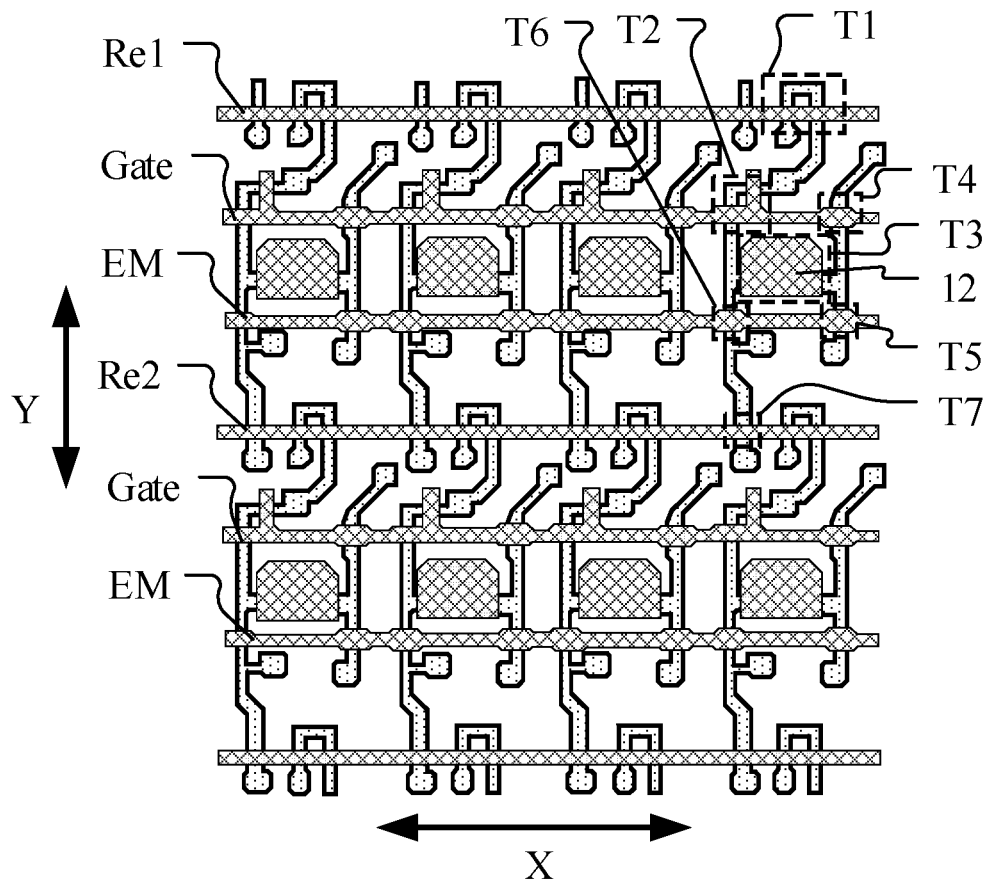
FIG. 12 is a structural layout of an active layer and a first conductive layer in FIG. 5.
Figure 13:
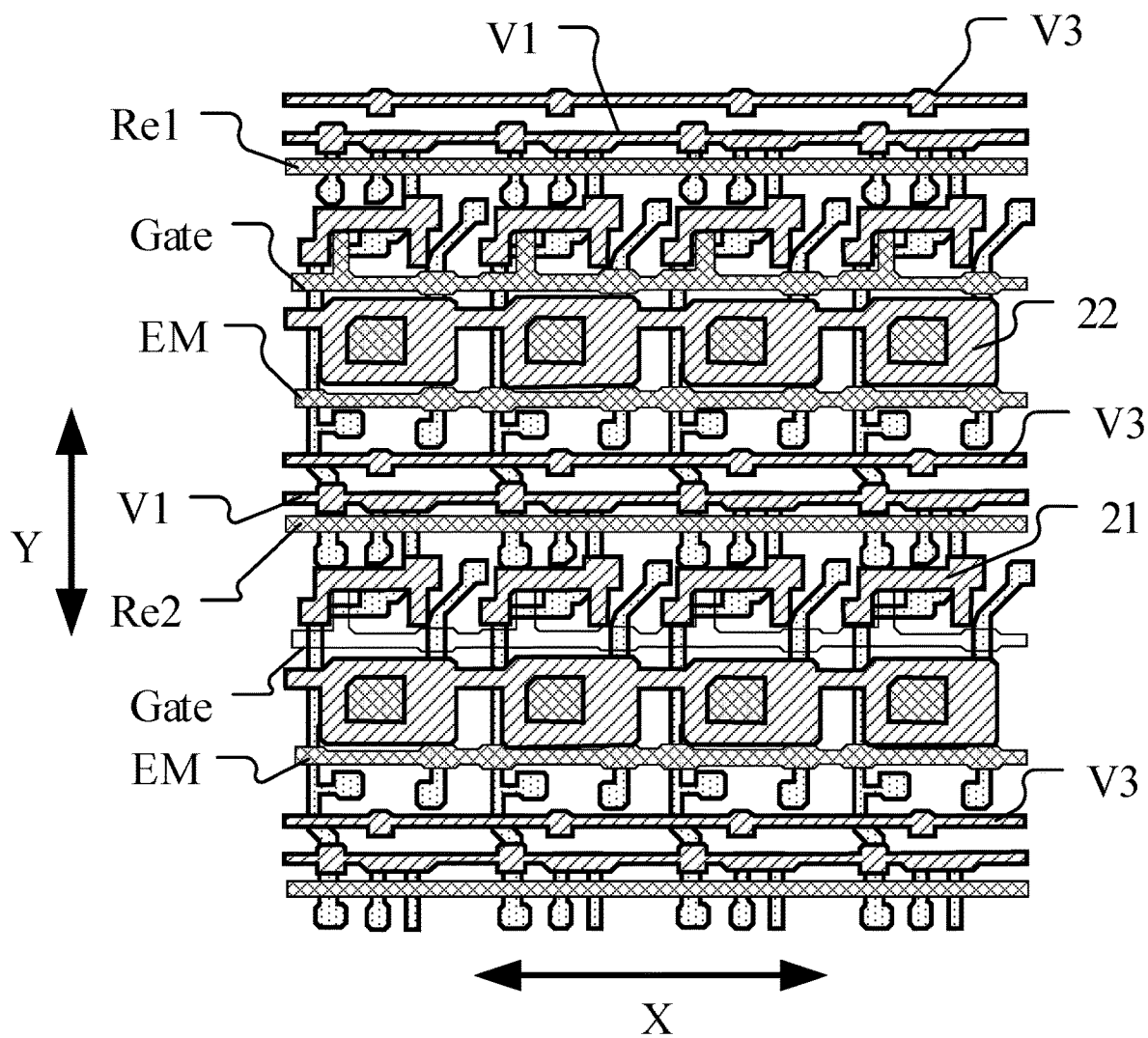
FIG. 13 is a structural layout of an active layer, a first conductive layer, and a second conductive layer in FIG. 5.
Figure 14:
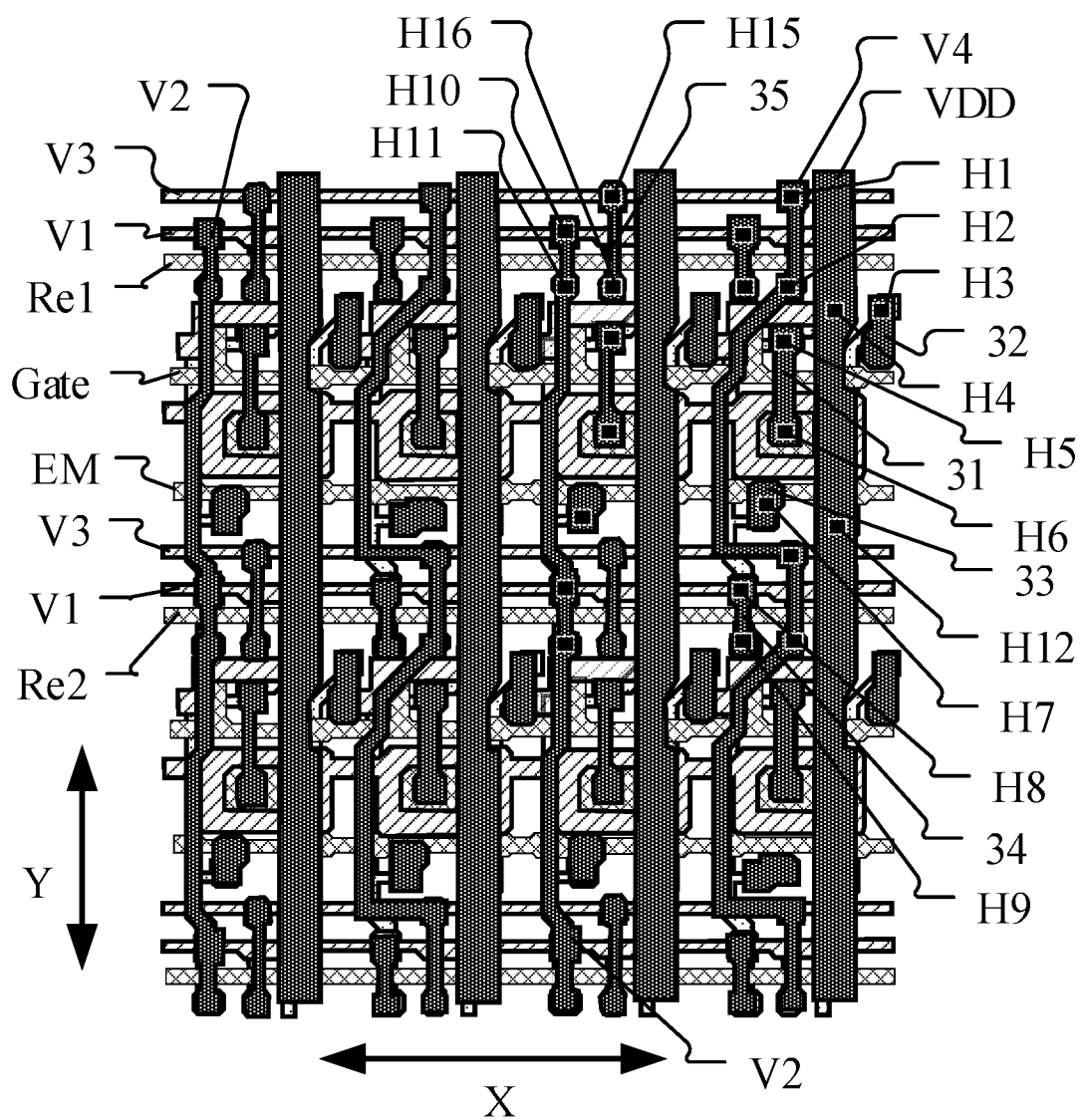
FIG. 14 is a structural layout of an active layer, a first conductive layer, a second conductive layer, and a third conductive layer in FIG. 5.
Figure 15:
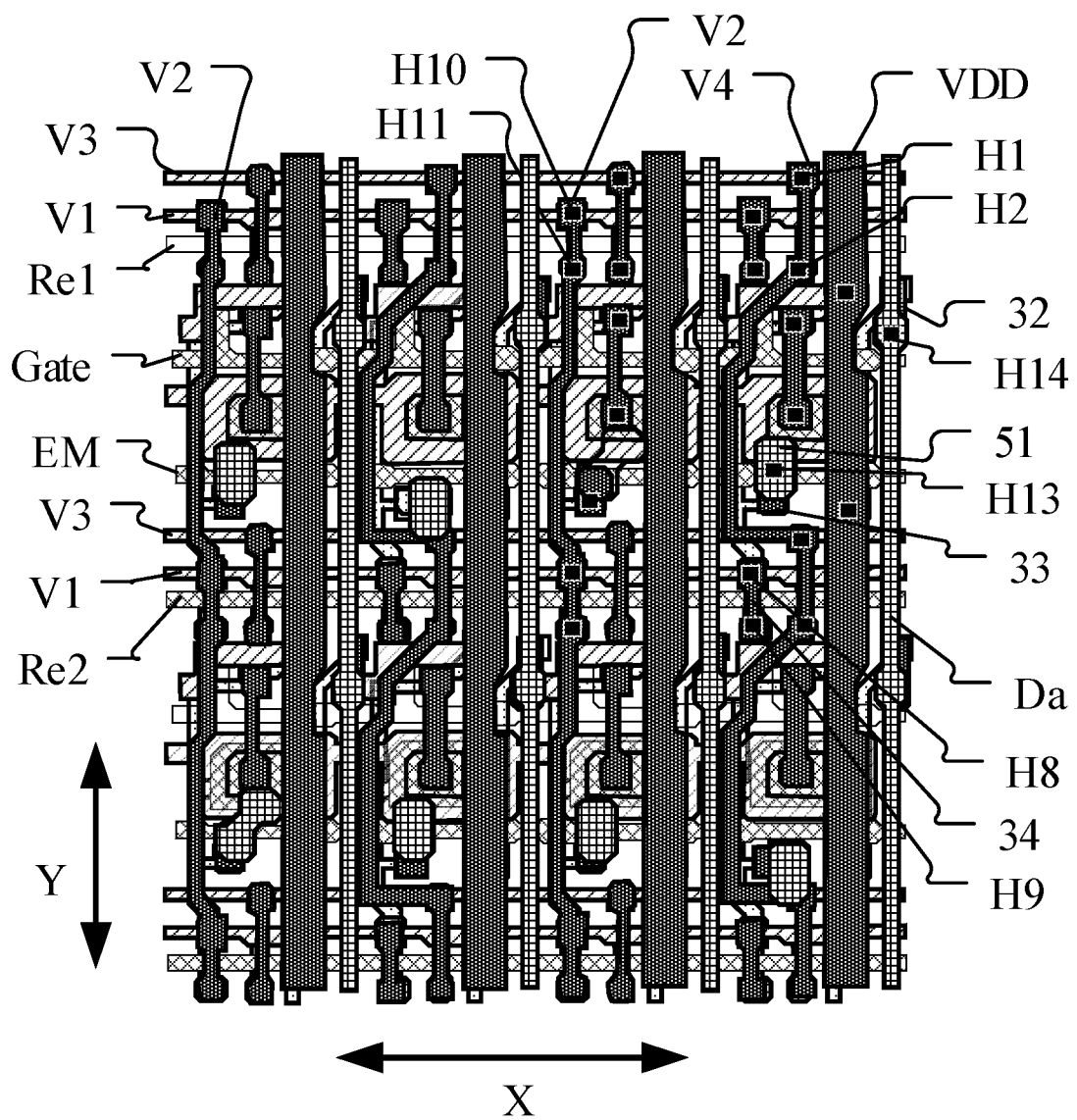
FIG. 15 is a structural layout of an active layer, a first conductive layer, a second conductive layer, a third conductive layer, and a fourth conductive layer in FIG. 5.

The display panel may further include an active layer, a first conductive layer, a fourth conductive layer, and an anode layer. The active layer, the first conductive layer, the second conductive layer, the third conductive layer, the fourth conductive layer, and the anode layer can be stacked in sequence. As shown in FIGS. 5-15, FIG. 5 is a structural layout diagram of a display panel according to an exemplary embodiment of the present disclosure; FIG. 6 is a structural layout of the active layer in FIG. 5; FIG. 7 is a structural layout of the first conductive layer in FIG. 5; FIG. 8 is a structural layout of the second conductive layer in FIG. 5; FIG. 9 is a structural layout of the third conductive layer in FIG. 5; FIG. 10 is a structural layout of the fourth conductive layer in FIG. 5; FIG. 11 is a structural layout of the anode layer in FIG. 5; FIG. 12 is a structural layout of the active layer and the first conductive layer in FIG. 5; FIG. 13 is a structural layout of the active layer, the first conductive layer, and the second conductive layer in FIG. 5; FIG. 14 is a structural layout of the active layer, the first conductive layer, the second conductive layer, and the third conductive layer in FIG. 5; FIG. 15 is a structural layout of the active layer, the first conductive layer, the second conductive layer, the third conductive layer, and the fourth conductive layer in FIG. 5.

As shown in FIGS. 5, 6, 12, 13, 14 and 15, the active layer may include multiple first active part groups 4, and the multiple first active part groups may be spaced apart in the first direction X. Each first active part group 4 may include multiple first active parts 41, and orthographic projections of the multiple first active parts 41 on the base substrate may be spaced apart in the second direction Y, and the orthographic projection of each first active part 41 on the base substrate extends in the second direction Y The first active part may include a fourth sub-active part 414, an active part 46, and an active part 47, and the fourth sub-active part 414 may be used to form a first channel region of the second transistor T2, the active part 46 may be used to form a channel region of the sixth transistor T6, and the active part 47 may be used to form a channel region of the seventh transistor T7. The active layer may further include a second active part 42, and an orthographic projection of the second active part 42 on the base substrate may extend in the second direction Y The second active part 42 may include a first sub-active part 421, and the first sub-active part 421 may be used to form a first channel region of the first transistor T1. The active layer may further include: a second sub-active part 422, a third sub-active part 423, a fifth sub-active part 415, and a sixth sub-active part 416, and the second sub-active part 422 may be used to form the second channel region of the first transistor T1, the third sub-active part 423 may be coupled between the first sub-active part 421 and the second sub-active part 422, and an orthographic projection of the third sub-active part 423 on the base substrate may extend in the first direction. The fifth sub-active part 415 may be used to form the second channel region of the second transistor T2, and the sixth sub-active part 416 may be coupled between the fifth sub-active part 415 and the fourth sub-active part 414. The active layer may further include: a seventh sub-active part 407, an active part 43, an active part 44, and an active part 45. The active part 43 can be used to form a channel region of the driving transistor T3, the active part 44 can be used to form a channel region of the fourth transistor T4, the active part 45 can be used to form a channel region of the fifth transistor T5, and the seventh sub-active part 407 may be coupled between the second sub-active part 422 and the fifth sub-active part 415. It should be noted that a part of a structure of the sixth sub-active part 416 may be formed by part of the first active part 41, that is, the sixth sub-active part 416 and the first active part 41 have an intersection.

As shown in FIGS. 5, 7, 12, 13, 14 and 15, the first conductive layer may include: a first reset signal line Re1, a second reset signal line Re2, a gate driving signal line Gate, an enable signal line EM, and a second conductive part 12. In the display panel, conductive treatment can by performed on the active layer by using the patterned first conductive layer as a mask, that is, a part shielded by the first conductive layer forms a semiconductor channel region, and a part not shielded by the first conductive layer forms a conductive active layer. The first reset signal line Re1 can be used to provide a reset signal to the first reset signal terminal in FIG. 1, the second reset signal line Re2 can be used to provide a reset signal to the second reset signal terminal in FIG. 1, the gate driving signal line Gate can be used to provide a driving signal to the gate driving signal terminal in FIG. 1, and the enable signal line EM can be used to provide an enable signal to the enable signal terminal in FIG. 1. Orthographic projections of the first reset signal line Re1, the second reset signal line Re2, the gate driving signal line Gate, and the enable signal line EM on the base substrate may all extend in the first direction X. A part of the structure of the first reset signal line Re1 can be used to form the gate of the first transistor T1, a part of the structure of the second reset signal line Re2 can be used to form the gate of the seventh transistor T7, a part of the structure of the gate driving signal line Gate may be used to form the first gate of the second transistor and the gate of the fourth transistor, and a part of the structure of the enable signal line EM may be used to form the gates of the sixth transistor T6 and the fifth transistor T5. An orthographic projection of the second conductive part 12 on the base substrate may cover the active part 43, and the second conductive part 12 may be used to form the gate of the driving transistor T3 and an electrode of the capacitor C.

As shown in FIGS. 5, 8, 13, 14 and 15, in addition to the first signal lines V1 and the third signal lines V3, the second conductive layer may also include multiple first conductive parts 21, multiple conductive parts 22 and multiple connection parts 23. Adjacent conductive parts 22 in the first direction X may be coupled by the connection part 23. The conductive part 22 may be provided with a through hole 221, and the conductive part 22 may form another electrode of the capacitor C in FIG. 1. The first conductive part 21 may include a first sub-conductive part 211, a second sub-conductive part 212, and a third sub-conductive part 213. The second sub-conductive part 212 may be coupled between the first sub-conductive part 211 and the third sub-conductive part 213. In the second direction Y, an orthographic projection of the second sub-conductive part 212 on the base substrate may be disposed between orthographic projections of two adjacent first active parts 41 on the base substrate, and in the second direction Y, the orthographic projection of the second sub-conductive part 412 on the base substrate may be disposed between the orthographic projection of the second active part 42 on the base substrate and the orthographic projection of the first active part 41 on the base substrate. In the second direction Y, an orthographic projection of the third sub-conductive part 413 on the base substrate may be disposed between the orthographic projection of the second sub-conductive part 412 on the base substrate and the orthographic projection of the gate driving signal line Gate on the base substrate. In addition, orthographic projections of the third signal line V3, the first signal line V1, the first reset signal line Re1, the first conductive part 21, the gate driving signal line Gate, the conductive part 22, and the enable signal line EM on the substrate can be spaced apart in sequence in the second direction Y.

As shown in FIGS. 5, 9, 14 and 15, in addition to the second signal lines V2 and the fourth signal lines V4, the third conductive layer may further include: a power line VDD, a first connection part 31, a second connection part 32, a third connection part 33, a fourth connection part 34, and a fifth connection part 35. As shown in FIG. 15, in a pixel driving circuit to which the fourth signal line V4 is correspondingly coupled, the fourth signal line V4 can be coupled to the third signal line V3 through the via hole H1, and coupled to the active layer on a side of the first sub-active part 421 away from the third sub-active part 423 through the via hole H2 so as to be coupled to the second electrode of the first transistor T1 and the first initial signal terminal. The first connection part 31 can be coupled to the seventh sub-active part 407 through the via hole H5, and coupled to the second conductive part 12 through the via hole H6 so as to be coupled to the second electrode of the second transistor T2 and the gate of the driving transistor T3. The via hole H6 penetrates the through hole 221 on the conductive part 22, that is, a conductor structure filled in the via hole H6 is insulated from the conductive part 22. The second connection part 32 may be coupled to the active layer on a side of the active part 44 through the via hole H3 to be coupled to the first electrode of the fourth transistor T4. The third connection part 33 may be coupled to the active layer between the active part 46 and the active part 47 through the via hole H7 to be coupled to the second electrode of the sixth transistor T6. The fourth connection part 34 can be coupled to the first signal line V1 through the via hole H8, and can be coupled to the active layer at an end of the active part 47 away from the active part 46 through the via hole H9, so as to be coupled to the second initial signal terminal and the first electrode of the seventh transistor T7. In a pixel driving circuit to which the second signal line V2 is correspondingly coupled, the second signal line V2 can be coupled to the first signal line V1 through the via hole H10, and coupled to the active layer at an end of the active part 47 away from the active part 46 through the via hole H11 so as to be coupled to the second initial signal terminal and the first electrode of the seventh transistor T7. The fifth connection part 35 can be coupled to the third signal line V3 through the via hole H15, and coupled to the active layer on a side of the first sub-active part 421 away from the third sub-active part 423 through the via hole H16 so as to be coupled to the second electrode of the first transistor T1 and the first initial signal terminal. In addition, the power line VDD can be coupled to the first conductive part 21 through the via hole H4, and the power line VDD can also be coupled to the active layer on a side of the active part 45 through the via hole H12 so as to be coupled to the first power terminal and the first electrode of the fifth transistor T5.

Figure 5:
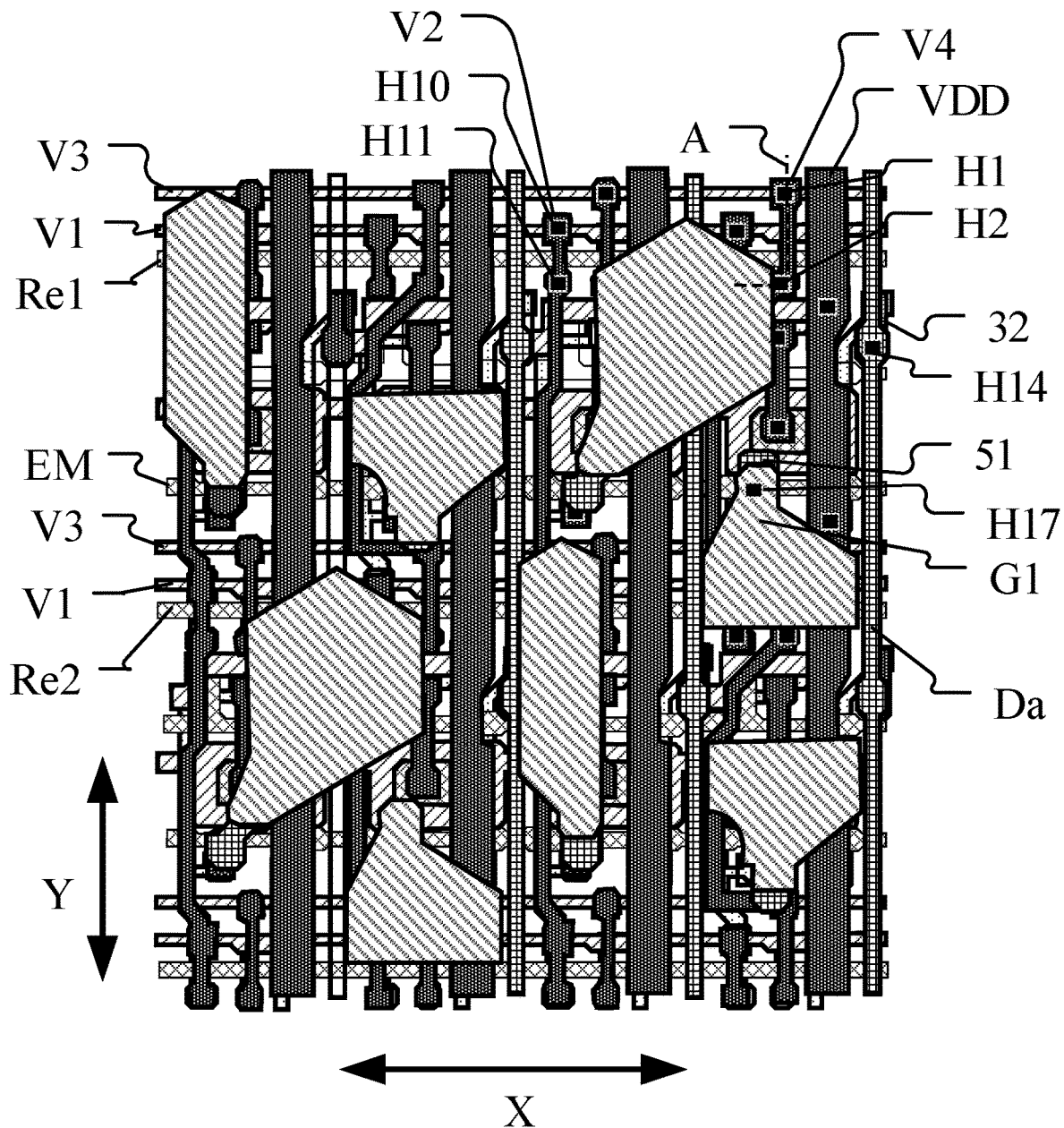
FIG. 5 is a structural layout diagram of a display panel according to an exemplary embodiment of the present disclosure.

As shown in FIGS. 5, 10 and 15, the fourth conductive layer may include: a data line Da and a connection part 51. The data line Da may be used to provide the data signal terminal in FIG. 1, and an orthographic projection of the data line Da on the base substrate may extend in the second direction Y As shown in FIG. 15, the data line Da may be coupled to the second connection part 32 through the via hole H14 so as to be coupled to the first electrode of the fourth transistor T4. The connection part 51 may be coupled to the third connection part 33 through the via hole H13. As shown in FIG. 15, an orthographic projection of the data line Da on the base substrate intersect with none of orthographic projections of the power line VDD, the second signal line V2 and the fourth signal line V4 on the base substrate. It should be understood that, in other exemplary embodiments, an orthographic projection of at least one of the power line VDD, the second signal line V2 and the fourth signal line V4 on the base substrate is at least partially overlapped with the orthographic projection of the data line Da on the base substrate, and this arrangement can reduce a layout area of the pixel driving circuit, thereby improving integration degree of a sub-pixel unit.

As shown in FIGS. 5 and 11, the anode layer may include anode parts R, G1, G2, and B, and pixel units in the display panel may be of RGGB structure. The anode part may be coupled to the connection part 51 through the via hole H17 so as to be coupled to the second electrode of the sixth transistor T6.

In this exemplary embodiment, as shown in FIGS. 9, 14 and 15, the multiple second signal lines V2 may be arranged in a one-to-one correspondence with a part of the first active part groups 4, and the second signal line V2 may include: multiple first extension parts V21 and a second extension part V22. The first extension part V21 may be arranged in a one-to-one correspondence with the first active parts 41, and orthographic projections of the first extension parts V21 on the base substrate may extend in the second direction Y, and any segment of the orthographic projection of the first extension parts V21 on the base substrate in their extension direction may be at least partially overlapped with the orthographic projection of a corresponding first active part on the base substrate. Any segment of the orthographic projection of the first extension part V21 on the base substrate in the extension direction of the first extension part V21 being at least partially overlapped with the orthographic projection of corresponding first active part on the base substrate can be understood as that the orthographic projection of the first extension part V21 on the base substrate and the orthographic projection of the first active part 41 on the base substrate have the same extension direction, and the overlapped orthographic projection and the orthographic projection of the first extension part V21 on the base substrate have the same extension direction. An orthographic projection of an extension side (that is, a side extending in the extension direction) of the overlapped orthographic projection on the base substrate is overlapped with an orthographic projection of at least one of extension sides of the first active part 41 on the base substrate. In this arrangement, the first extension part V21 is arranged directly above the first active part, thereby reducing the shading effect of the first extension part V21 on the display panel. In addition, the second extension part V22 may be coupled between two adjacent first extension parts V21, and an orthographic projection of the second extension part V22 on the base substrate may be not overlapped with the orthographic projections of the first active parts 41 on the base substrate.

As shown in FIGS. 8, 13, 14 and 15, a part of the first conductive parts 21 may be arranged corresponding to the second signal lines V2. An orthographic projection of the second sub-conductive part 212 on the base substrate may be at least partially overlapped with an orthographic projection of the second extension part V22 on the base substrate. In this arrangement, the second extension part V22 is arranged directly above the second sub-conductive part 212, thereby reducing the shading effect of the second extension part V22 on the display panel.

In this exemplary embodiment, as shown in FIGS. 9, 14 and 15, the multiple fourth signal lines V4 may be arranged in a one-to-one correspondence with a part of the first active part groups 4. The fourth signal line V4 may include multiple third extension parts V43 arranged in a one-to-one correspondence with the first active parts 41. Orthographic projections of the third extension parts V43 on the base substrate may extend in the second direction Y. Any segment of the orthographic projection of the third extension part V43 on the base substrate in the extension direction thereof may be at least partially overlapped with the orthographic projection of corresponding first active part 41 on the base substrate. In this arrangement, the third extension part V43 is disposed directly above the first active part 41, thereby reducing the shading effect of the third extension part V43 on the display panel.

In this exemplary embodiment, as shown in FIGS. 9, 14 and 15, the fourth signal line V4 may further include a fourth extension part V44 coupled between adjacent third extension parts V43. Orthographic projections of the fourth extension parts V44 on the base substrate may extend in the first direction X, and any segment of the orthographic projection of the fourth extension part on the base substrate in the extension direction thereof may be at least partially overlapped with the orthographic projection of the third signal line V3 on the base substrate. In this arrangement, the fourth extension part V44 can be disposed directly above the third signal line V3, thereby reducing the shading effect of the fourth extension part V44 on the display panel.

In this exemplary embodiment, as shown in FIGS. 9, 14 and 15, the fourth signal line V4 may further include a fifth extension part V45 coupled between the fourth extension part V44 and the third extension part V43 that are adjacent to each other. An orthographic projection of the fifth extension part V45 on the base substrate may extend in the second direction Y, and any segment of the orthographic projection of the fifth extension part V45 on the base substrate in the extension direction thereof may be at least partially overlapped with the orthographic projection of the second active part 42 on the base substrate. In this arrangement, the fifth extension part V45 can be arranged directly above the second active part 42, thereby reducing the shading effect of the fifth extension part V45 on the display panel.

In this exemplary embodiment, as shown in FIGS. 9, 14 and 15, the fourth signal line V4 may further include a sixth extension part V46 coupled between the fifth extension part V45 and the third extension part V43 that are adjacent to each other. An orthographic projection of the sixth extension part V46 on the base substrate may be at least partially overlapped with an orthographic projection of the second sub-conductive part 212 on the base substrate. In this arrangement, the sixth extension part V46 can be disposed directly above the second sub-conductive part 212, thereby reducing the shading effect of the sixth extension part V46 on the display panel.

In this exemplary embodiment, as shown in FIGS. 6, 8 and 13, the orthographic projection of the first signal line V1 on the base substrate may be at least partially overlapped with the orthographic projection of the third sub-active part 423 on the base substrate, and this arrangement can reduce the shading effect of the first signal line V1 on the display panel. In addition, a voltage of the third sub-active part 423 is prone to change under the action of other signals, thereby causing the current leakage from the third sub-active part 423 to the source and drain of the first transistor T1. In this exemplary embodiment, the first signal line V1 may have a stable voltage, and the first signal line V1 and the third sub-active part 423 form a parallel-plate capacitor structure, so that the first signal line V1 may stabilize the voltage of the third sub-active part 423, and the first signal line V1 can reduce the voltage change of the third sub-active part 423 under the action of other signals, thereby reducing the current leakage from the third sub-active part 423 to the source and drain of the first transistor T1.

In this exemplary embodiment, as shown in FIGS. 6, 8 and 13, the second transistor T2 has a double-gate structure, and the sixth sub-active part 416 may also leak current to the source and drain of the second transistor T2 under the interference of other signals. An orthographic projection of the first sub-conductive part 211 on the base substrate may be at least partially overlapped with the orthographic projection of the sixth sub-active part 416 on the base substrate. Since the first sub-conductive part 211 is coupled to the power line VDD, the first sub-conductive part 211 with a stable voltage can stabilize the voltage of the sixth sub-active part 416, thereby reducing the current leakage from the sixth sub-active part 416 to the second transistor T2.

In this exemplary embodiment, as shown in FIGS. 8, 9 and 14, the third sub-conductive part 213 and the first connection part 31 can form a larger lateral capacitance. Since the third sub-conductive part 213 is coupled to the power line VDD, the third sub-conductive part 213 with a stable voltage can stabilize the voltage of the first connection part 31, thus this arrangement can reduce the voltage fluctuation of the gate of the driving transistor T3 at the light emitting node.

In this exemplary embodiment, as shown in FIGS. 5 and 9, the second signal line V2 and the fourth signal line V4 may be alternately distributed in the first direction X. The multiple second signal lines V2 and the multiple fourth signal lines V4 may form multiple initial signal lines. Each column of the pixel driving circuits may be correspondingly coupled to one of the initial signal lines. As shown in FIG. 5, in this exemplary embodiment, the pixel driving circuit correspondingly coupled to the second signal line V2 may be located in a red or blue sub-pixel unit, and the pixel driving circuit correspondingly coupled to the fourth signal line V4 may be located in a green sub-pixel unit. It should be understood that, in other exemplary embodiments, the pixel driving circuit correspondingly coupled to the fourth signal line V4 may be located in the red or blue sub-pixel unit, and the pixel driving circuit correspondingly coupled to the second signal line V2 may be located in the green sub-pixel unit.

In this exemplary embodiment, a sheet resistance of the second conductive layer may be greater than a sheet resistance of the third conductive layer. In this exemplary embodiment, the second conductive layer may include a molybdenum layer. The third conductive layer may include a first titanium layer, an aluminum layer, and a second titanium layer. The first titanium layer may be disposed on a side of the first conductive layer away from the base substrate. The aluminum layer may be disposed on a side of the first titanium layer away from the base substrate. The second titanium layer may be disposed on a side of the aluminum layer away from the base substrate.

In this exemplary embodiment, as shown in FIG. 9, the power line VDD may include an extension part VD1 and an extension part VD2, and a size of the extension part VD1 in the first direction may be smaller than that of the extension part VD2 in the first direction. An orthographic projection of the extension part VD1 on the base substrate may intersect with an orthographic projection of the gate driving signal line Gate on the base substrate. This arrangement can reduce the capacitance between the power line VDD and the gate driving signal line Gate, thereby reducing the coupling effect of the power line VDD on the gate driving signal line Gate, so that the gate driving signal line Gate can have a faster charging speed.

Figure 16:
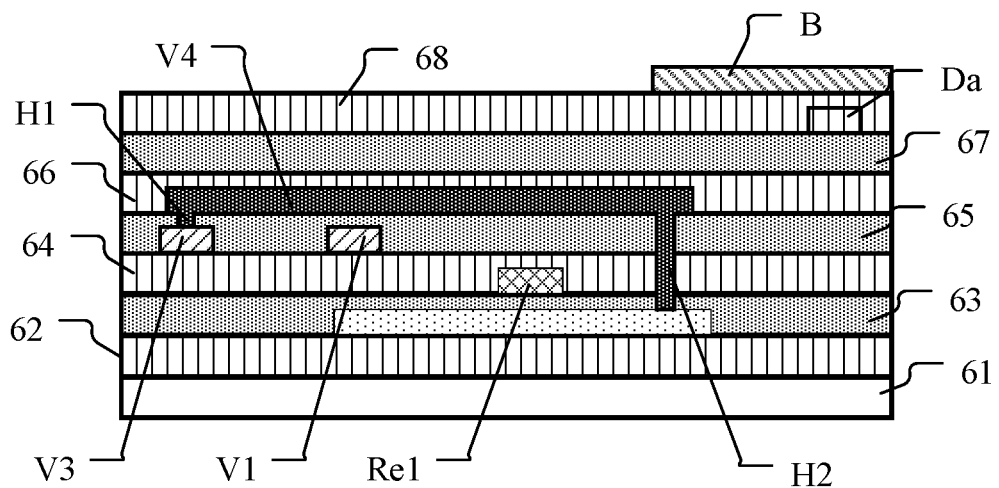
FIG. 16 is a partial cross-sectional view taken along a dotted line 'A' in FIG. 5.

As shown in FIG. 16, which is a partial cross-sectional view taken along a dotted line 'A' in FIG. 5, the display panel may further include: a buffer layer 62, a first insulating layer 63, a second insulating layer 64, a dielectric layer 65, a passivation layer 66, a first flat layer 67, and a second flat layer 68. The base substrate 61, the buffer layer 62, the active layer, the first insulating layer 63, the first conductive layer, the second insulating layer 64, the second conductive layer, the dielectric layer 65, the third conductive layer, the passivation layer 66, the first flat layer 67, the fourth conductive layer, the second flat layer 68, and the anode layer can be stacked in sequence. The buffer layer 62 may include at least one of a silicon oxide layer and a silicon nitride layer. The first insulating layer 63 and the second insulating layer 64 may be silicon oxide layers. The dielectric layer 65 may be a silicon nitride layer. The passivation layer 66 can be a silicon nitride layer. Materials of the first flat layer 67 and the second flat layer 68 can be transparent polyimide (CPI), polyethylene terephthalate (PET), polyethylene naphthalene ethylene glycol formate (PEN) or the like. A material of the active layer can be polysilicon semiconductor or metal oxide semiconductor. A material of the anode layer can be indium tin oxide.

Figure 17:
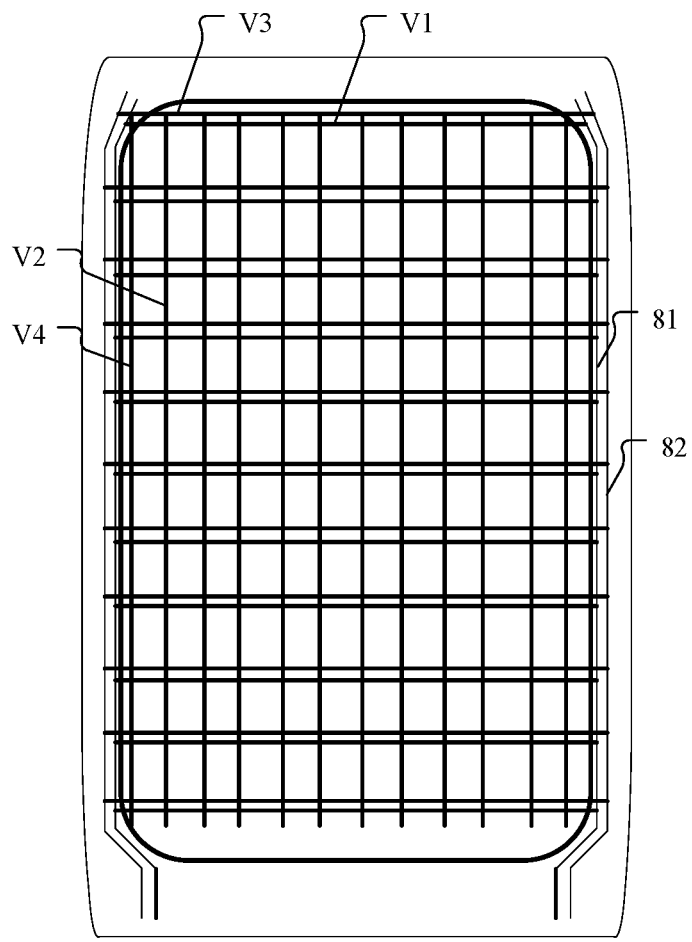
FIG. 17 is a schematic structural diagram of a display panel according to an exemplary embodiment of the present disclosure.

FIG. 17 is a schematic structural diagram of a display panel according to an exemplary embodiment of the present disclosure. As shown in FIG. 17, in the display panel, the first signal lines V1 and the third signal lines V3 extend in a row direction, and the second signal lines V2 and the fourth signal lines V4 extend in a column direction. The first signal line V1 can be coupled to a signal transmission line 81, and the signal transmission line 81 can be located in a non-display area on both sides of the display panel and extend in the column direction; and the third signal line V3 can be coupled to a signal transmission line 82, and the signal transmission line 82 can be located in the non-display area on both sides of the display panel and extend in the column direction. The signal transmission line 81 and the signal transmission line 82 can be coupled to a chip for providing an initial signal. The second signal line V2 and the fourth signal line may be directly coupled to a chip for providing the initial signal.

The exemplary embodiment also provides a display device including the above-mentioned display panel. The display device may be a mobile phone, a tablet computer, or the like.

It should be understood that the present disclosure is not limited to the precise structures that have been described above and shown in the drawings, and various modifications and changes can be made without departing from the scope thereof. The scope of the present disclosure is limited only by the appended claims.

What is claimed is:

1. A display panel comprising a pixel driving circuit, wherein the display panel further comprises:
   a base substrate;
   a second conductive layer, disposed on a side of the base substrate and comprising multiple first signal lines, wherein orthographic projections of the multiple first signal lines on the base substrate extend in a first direction and are spaced apart in a second direction, and the first direction and the second direction intersect; and
   a third conductive layer, disposed on a side of the second conductive layer away from the base substrate and comprising multiple second signal lines, wherein orthographic projections of the multiple second signal lines on the base substrate extend in the second direction and are spaced apart in the first direction;
   wherein the first signal lines and the second signal lines are configured to provide a same first signal to the pixel driving circuit, and at least part of the first signal lines and at least part of the second signal lines are coupled through via holes;
   wherein the second conductive layer further comprises multiple third signal lines, wherein orthographic projections of the multiple third signal lines on the base substrate extend in the first direction and are spaced apart in the second direction; and
   the third conductive layer further comprises multiple fourth signal lines, wherein orthographic projections of the multiple fourth signal lines on the base substrate extend in the second direction and are spaced apart in the first direction;
   wherein the third signal lines and the fourth signal lines are configured to provide a same second signal to the pixel driving circuit, and at least part of the third signal lines and at least part of the fourth signal lines are coupled through via holes.

2. The display panel according to claim 1, wherein the display panel comprises a light emitting unit driven by the pixel driving circuit, and the pixel driving circuit comprises multiple transistors, the display panel further comprises: an active layer, disposed between the base substrate and the second conductive layer, at least part of a structure of the active layer is configured to form channel regions of at least part of the transistors, and the active layer comprises:
   multiple first active part groups spaced apart in the first direction, wherein the first active part group comprises:
     multiple first active parts, wherein orthographic projections of the multiple first active parts on the base substrate are spaced apart in the second direction, and the orthographic projection of the first active part on the base substrate extends in the second direction.

3. The display panel according to claim 2, wherein the multiple transistors comprise:

a driving transistor, configured to output a driving current to a first electrode of the driving transistor based on a voltage of a gate of the driving transistor;

a second transistor, comprising: a second electrode coupled to the gate of the driving transistor, a first electrode coupled to the first electrode of the driving transistor, and a gate coupled to a gate driving signal terminal;

a sixth transistor, comprising: a first electrode coupled to the first electrode of the driving transistor, a second electrode coupled to a first electrode of the light emitting unit, and a gate coupled to an enable signal terminal; and a seventh transistor, comprising: a first electrode, configured to receive a second initial signal; and a second electrode coupled to the first electrode of the light emitting unit;

wherein a part of a structure of the first active part is configured to form a first channel region of the second transistor, and channel regions of the sixth transistor and the seventh transistor.

4. The display panel according to claim 2, wherein the multiple second signal lines are arranged in a one-to-one correspondence with a part of the first active part groups, and the second signal line comprises:

multiple first extension parts, arranged in a one-to-one correspondence with the first active parts, wherein orthographic projections of the first extension parts on the base substrate extend in the second direction, and any segment of the orthographic projection of the first extension parts on the base substrate in the extension direction of the first extension part is at least partially overlapped with an orthographic projection of the first active part corresponding to the first extension part on the base substrate; and a second extension part, coupled between two adjacent first extension parts, wherein an orthographic projection of the second extension part on the base substrate is not overlapped with the orthographic projections of the first active parts on the base substrate.

5. The display panel according to claim 1, wherein the display panel comprises a light emitting unit driven by the pixel driving circuit, and the pixel driving circuit comprises a seventh transistor, a first electrode of the seventh transistor is configured to receive a second initial signal, a second electrode is configured to be coupled to a first electrode of the light emitting unit; and the first signal lines and the second signal lines are configured to provide the second initial signal to the first electrode of the seventh transistor.

6. The display panel according to claim 4, wherein the multiple fourth signal lines are arranged in a one-to-one correspondence with a part of the first active part groups, and the fourth signal line comprises:

multiple third extension parts, arranged in a one-to-one correspondence with the first active parts, wherein an orthographic projection of the third extension part on the base substrate extends in the second direction, and any segment of the orthographic projection of the third extension part on the base substrate in the extension direction thereof is at least partially overlapped with an orthographic projection of the first active part corresponding to the third extension part on the base substrate.

7. The display panel according to claim 6, wherein the fourth signal line further comprises:

a fourth extension part, coupled between adjacent third extension parts, wherein an orthographic projection of the fourth extension part on the base substrate extends in the first direction, and any segment of the orthographic projection of the fourth extension part on the base substrate in the extension direction thereof is at least partially overlapped with the orthographic projection of the third signal line on the base substrate.

8. The display panel according to claim 7, wherein the multiple transistors comprises a driving transistor and a first transistor, a second electrode of the first transistor is configured to receive a first initial signal, and a first electrode of the first transistor is coupled to a gate of the driving transistor, and the active layer further comprises:

a second active part, wherein an orthographic projection of the second active part on the base substrate extends in the second direction, and the second active part comprises a first sub-active part configured to form a first channel region of the first transistor; and the fourth signal line further comprises:

a fifth extension part, coupled between the fourth extension part and the third extension part that are adjacent to each other, wherein an orthographic projection of the fifth extension part on the base substrate extends in the second direction, and any segment of the orthographic projection of the fifth extension part on the base substrate in the extension direction thereof is at least partially overlapped with an orthographic projection of the second active part on the base substrate.

9. The display panel according to claim 1, wherein the pixel driving circuit comprises a driving transistor and a first transistor, a second electrode of the first transistor is configured to receive a first initial signal, and a first electrode of the first transistor is coupled to a gate of the driving transistor; and the third signal lines and the fourth signal lines are configured to provide the first initial signal.

10. The display panel according to claim 8, wherein the active layer further comprises:

a second sub-active part, configured to form a second channel region of the first transistor; and a third sub-active part, coupled between the first sub-active part and the second sub-active part, wherein an orthographic projection of the third sub-active part on the base substrate extends in the first direction;

wherein the orthographic projection of the first signal line on the base substrate is at least partially overlapped with the orthographic projection of the third sub-active part on the base substrate.

11. The display panel according to claim 10, wherein the multiple transistors further comprises:

a second transistor, comprising: a second electrode coupled to the gate of the driving transistor, a first electrode coupled to the first electrode of the driving transistor, and a gate coupled to a gate driving signal terminal;

the first active part further comprises: a fourth sub-active part, configured to form a first channel region of the second transistor;

the active layer further comprises:

a fifth sub-active part, configured to form a second channel region of the second transistor; and a sixth sub-active part, coupled between the fourth sub-active part and the fifth sub-active part;

the second conductive layer further comprises:

multiple first conductive parts, wherein the first conductive part comprises a first sub-conductive part, an orthographic projection of the first sub-conductive part on the base substrate is at least partially overlapped with an orthographic projection of the sixth sub-active part on the base substrate.

12. The display panel according to claim 11, wherein the fourth signal line further comprises:
a sixth extension part, coupled between the fifth extension part and the third extension part that are adjacent to each other;
the first conductive part further comprises:
a second sub-conductive part, coupled to the first sub-conductive part, wherein in the second direction, an orthographic projection of the second sub-conductive part on the base substrate is disposed between orthographic projections of two adjacent first active parts on the base substrate, and in the second direction, the orthographic projection of the second sub-conductive part on the base substrate is disposed between the orthographic projection of the second active part on the base substrate and the orthographic projection of the first active part on the base substrate;
a part of the first conductive parts are arranged correspondingly to the second signal lines, and a part of the first conductive parts are arranged correspondingly to the fourth signal lines;
an orthographic projection of the second sub-conductive part arranged correspondingly to the second signal line on the base substrate is at least partially overlapped with an orthographic projection of the second extension part on the base substrate; and
an orthographic projection of the second sub-conductive part arranged correspondingly to the fourth signal line on the base substrate is at least partially overlapped with an orthographic projection of the sixth extension part on the base substrate.

13. The display panel according to claim 12, wherein the display panel further comprises: a first conductive layer disposed between the active layer and the second conductive layer, and the first conductive layer comprises:
a second conductive part, configured to form the gate of the driving transistor; and
a gate driving signal line, wherein a part of the gate driving signal line is configured to form a first gate of the second transistor, an orthographic projection of the gate driving signal line on the base substrate extends in the first direction, and the orthographic projection of the gate driving signal line on the base substrate is disposed between an orthographic projection of the second conductive part on the base substrate and the orthographic projection of the first signal line on the base substrate;
the active layer further comprises:
a seventh sub-active part, coupled between the fifth sub-active part and the second sub-active part;
the third conductive part further comprises:
a first connection part, coupled to the seventh sub-active part and the second conductive part through via holes, respectively;
the first conductive part further comprises:
a third sub-conductive part, coupled to the second sub-conductive part, wherein in the second direction, an orthographic projection of the third sub-conductive part on the base substrate is disposed between the orthographic projection of the second sub-conductive part on the base substrate and an orthographic projection of the gate driving signal line on the base substrate.

14. The display panel according to claim 8, wherein the second signal lines and the fourth signal lines are alternately arranged in sequence in the first direction;
the multiple second signal lines and the multiple fourth signal lines form multiple initial signal lines; and
the second direction is a column direction, and each column of the pixel driving circuits is correspondingly coupled to one of the initial signal lines.

15. The display panel according to claim 14, wherein a pixel driving circuit correspondingly coupled to the second signal line is located in a red or blue sub-pixel unit, and a pixel driving circuit correspondingly coupled to the fourth signal line is located in a green sub-pixel unit.

16. The display panel according to claim 1, wherein a sheet resistance of the second conductive layer is greater than a sheet resistance of the third conductive layer.

17. The display panel according to claim 1, wherein the third conductive layer further comprises:
a power line, wherein an orthographic projection of the power line on the base substrate extends in the second direction, and the power line is configured to provide a power signal.

18. A display device comprising a display panel, wherein the display panel comprises a pixel driving circuit, and the display panel further comprises:
a base substrate;
a second conductive layer, disposed on a side of the base substrate and comprising multiple first signal lines, wherein orthographic projections of the multiple first signal lines on the base substrate extend in a first direction and are spaced apart in a second direction, and the first direction and the second direction intersect; and
a third conductive layer, disposed on a side of the second conductive layer away from the base substrate and comprising multiple second signal lines, wherein orthographic projections of the multiple second signal lines on the base substrate extend in the second direction and are spaced apart in the first direction;
wherein the first signal lines and the second signal lines are configured to provide a same first signal to the pixel driving circuit, and at least part of the first signal lines and at least part of the second signal lines are coupled through via holes;
wherein the second conductive layer further comprises multiple third signal lines, wherein orthographic projections of the multiple third signal lines on the base substrate extend in the first direction and are spaced apart in the second direction; and
the third conductive layer further comprises multiple fourth signal lines, wherein orthographic projections of the multiple fourth signal lines on the base substrate extend in the second direction and are spaced apart in the first direction;
wherein the third signal lines and the fourth signal lines are configured to provide a same second signal to the pixel driving circuit, and at least part of the third signal lines and at least part of the fourth signal lines are coupled through via holes.

* * * * *

UNITED STATES PATENT AND TRADEMARK OFFICE
CERTIFICATE OF CORRECTION

PATENT NO. : 12,073,783 B2
APPLICATION NO. : 17/638991
DATED : August 27, 2024
INVENTOR(S) : Shang et al.

Page 1 of 1

It is certified that error appears in the above-identified patent and that said Letters Patent is hereby corrected as shown below:

On the Title Page

Please correct the name of the 1st Assignee in item (73) to read as follows:
CHENGDU BOE OPTOELECTRONICS TECHNOLOGY CO., LTD., Sichuan (CN)

Signed and Sealed this
Twenty-second Day of October, 2024

Katherine Kelly Vidal
*Director of the United States Patent and Trademark Office*